(12) United States Patent
Moriya et al.

(10) Patent No.: US 7,589,018 B2
(45) Date of Patent: Sep. 15, 2009

(54) METHOD OF FORMING CONTACT HOLE, METHOD OF MANUFACTURING WIRING BOARD, METHOD OF MANUFACTURING SEMICONDUCTOR DEVICE, AND METHOD OF MANUFACTURING ELECTRO-OPTICAL DEVICE

(75) Inventors: Soichi Moriya, Chino (JP); Takeo Kawase, Suwa (JP); Mitsuaki Harada, Chino (JP); Takehisa Saeki, Suwa (JP); Tomoyuki Okuyama, Chino (JP); Hirofumi Hokari, Chino (JP); Takashi Aoki, Suaw (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/973,193

(22) Filed: Oct. 5, 2007

(65) Prior Publication Data

US 2008/0113466 A1 May 15, 2008

(30) Foreign Application Priority Data

| Nov. 9, 2006 | (JP) | ............................ 2006-304423 |
| Jan. 22, 2007 | (JP) | ............................ 2007-011763 |
| Jan. 22, 2007 | (JP) | ............................ 2007-011766 |

(51) Int. Cl.
*H01L 21/44* (2006.01)

(52) U.S. Cl. .............................. 438/666; 257/E21.597

(58) Field of Classification Search ................. 438/637, 438/666, 668; 257/E21.597
See application file for complete search history.

(56) References Cited

U.S. PATENT DOCUMENTS 5,585,675 A * 12/1996 Knopf ........................ 257/774
2006/0046475 A1 * 3/2006 Wark et al. .................. 438/667

FOREIGN PATENT DOCUMENTS

| JP | 2002-026362 A | 1/2002 |
| JP | 2006-041180 A | 2/2006 |

* cited by examiner

*Primary Examiner*—W. David Coleman
(74) *Attorney, Agent, or Firm*—Advantage Law Group, LLC

(57) ABSTRACT

A method of forming a contact hole includes forming a first conductive layer patterned so as to serve as an electrode or a wiring on a substrate, forming an insulation layer on the substrate and the first conductive layer, inserting a cutting instrument into the insulation layer at an angle to a surface of the insulation layer, the angle being in the range from 5° to 80°, and forming a tapered opening extending to the electrode or the wiring in the insulation layer by drawing out the cutting instrument.

19 Claims, 33 Drawing Sheets

SOLUTION INJECTION

LOW PRESSURE SUCTION

METHOD OF FORMING CONTACT HOLE, METHOD OF MANUFACTURING WIRING BOARD, METHOD OF MANUFACTURING SEMICONDUCTOR DEVICE, AND METHOD OF MANUFACTURING ELECTRO-OPTICAL DEVICE

BACKGROUND

1. Technical Field

The present invention relates to a method of manufacturing a circuit board, a method of manufacturing a semiconductor device, and a method of manufacturing an electro-optical device including a liquid crystal device, an organic electroluminescent (EL) device, or an electrophoretic device, and in particular to a method of forming a passage in an insulation layer (contact hole forming method).

2. Related Art

Semiconductor devices using organic transistors made of a semiconductor material, an organic insulation material, an organic conductive material, or the like have been developed. A transistor made of such an organic material (hereinafter, referred to as "organic transistor") is generally formed by depositing or coating an organic material on a plastic substrate. The combination of an organic material on a plastic substrate has great flexibility, which makes it ideal for the manufacture of electronic devices using organic transistors, which are light, thin, and bendable.

The organic transistor is formed by repeatedly alternately performing a step of depositing (or coating) an organic insulation material or an organic conductive material and a step of patterning the organic insulation material or the organic conductive material. In this method, a contact hole forming process to form a contact hole in an interlayer insulation layer is needed to enable wiring interconnection between conductive layers.

As for a method of forming a contact hole in the organic insulation material, a photolithography process or an etching process is disadvantageous in that it is difficult to strip off photoresist serving as a mask from a base layer made of an organic insulation material because the photoresist is made of an organic material (polymer) and further in that an organic semiconductor material which is an under-layer of the mask deteriorates because the organic semiconductor material causes photoreaction with the mask during exposure.

In order to solve the problem, JP-A-2002-26362 and JP-A-2006-41180 disclose techniques in which a contact hole is formed without using a photolithography process or an etching process. JP-A-2002-26362 discloses a punching method using a heated puncher, in which a contact hole is formed in a stacked structure using the heated puncher. JP-A-2006-41180 discloses a chemical method in which a contact hole is formed by chemically dissolving an inter-layer film 32 by use of a solvent contained in a needle while mechanically penetrating the inter-layer film 32 using the needle.

The above-mentioned techniques have the following disadvantageous effects. First, at the time of pricking the needle in the inter-layer insulation film, it is apt to generate residue with a height of several micrometers around an edge of a contact hole because the inter-layer insulation film made of an organic insulation material (polymer) has ductility and high viscosity. Second, it is difficult to check whether the inter-layer insulation film is completely removed and a base electrode under the inter-layer film is exposed. In particular, such checking is more difficult in the case of using a flexible substrate having low rigidity, such as a plastic substrate. The above problems lead to insecure interconnection (electrical conduction) between conductive layers (electrode•wirings) when the conductive layers are connected by a conductive material provided in the contact hole.

SUMMARY

An advantage of some aspects of the invention is that it provides a contact hole forming method, which is capable of suppressing electrical conduction failure, and a semiconductor device manufacturing method with high reliability.

An aspect of the invention is to provide a method of forming a contact hole including forming a first conductive layer patterned so as to serve as an electrode or a wiring on a substrate, forming an insulation layer on the substrate and the first conductive layer, inserting a cutting instrument into the insulation layer at an angle to a surface of the insulation layer, the angle being in the range from 5° to 80°, and forming a tapered opening extending to the electrode or the wiring in the insulation layer by drawing out the cutting instrument.

Thanks to the method, residue of the insulation layer generated when the cutting instrument cuts the insulation layer gathers on one side edge (front side edge in moving direction of the cutting instrument) of the tapered opening, and an electrode or a wiring is formed on another side edge (back side edge in moving direction of the cutting instrument) of the tapered opening at which the residue does not exist. Accordingly, it is possible to prevent the residue from affecting the electrode or wiring.

In the method, it is preferable that moving the cutting instrument inserted into the insulation layer in a direction in which the electrode or wiring extends is performed after insertion of the cutting instrument. For example, a moving distance of the cutting instrument is about 10 to 500 µm and is set according to diameter of the opening. By moving the cutting instrument, it is possible to form a large size opening and thus it is possible to prevent the opening from being closed (decreased in size) due to ductility of the insulation layer.

In the method, it is preferable that depositing a conductive material on the insulation layer and in the tapered opening by moving a liquid ejection head relative to the substrate in a direction in which the cutting instrument is inserted is performed so as to form a second conductive film patterned so as to serve as an electrode or a wiring, after formation of the tapered opening. By this method, it is possible to form a conductive pattern using a liquid conductive material on the insulation layer and in the opening, and in particular around the circumferential edge of the opening at a position where the residue does not exist, and thus it is possible to prevent short circuit from occurring due to the residue.

In the method, it is preferable that performing surface treatment with respect to a surface of the electrode or the wiring formed of the first conductive layer at a position where the opening is formed is performed in order to degrade adhesion between the electrode or the wiring and the insulation layer. The surface treatment is performed in order to degrade adhesion between the organic insulation layer (polymer) and the electrode or wiring and may be performed by a fluorine coating method, a fluorine plasma treatment method, or a SAM forming method. The surface treatment facilitates removal of the insulation layer by the cutting instrument.

In the method, it is preferable that the substrate is heated during formation of the insulation layer. In the case of forming the insulation layer using an organic material, heating the substrate lowers (softens) rigidity of the insulation layer. Accordingly, it is possible to facilitate cutting of the insulation layer or prevent the insulation layer from cracking. Further, in the case in which the substrate is made of an organic material (polymer), the heating lowers rigidity of the substrate and thus prevent the substrate from cracking.

In the method, it is preferable that the angle of the cutting instrument when it is inserted into the insulation layer is in the range from 20° to 60°. When the angle is in the range from 5° to 80°, it is possible to control the residue to exit only on one side edge of the opening. However, in the case in which the angle is in the range from 20° to 60°, it is possible to gather the residue of the insulation layer on one side edge of the opening, and thus it is possible to further decrease the amount of residue on the other side edge of the opening. In the case in which the angle is in the range from 80° to 90°, a material for the organic insulation layer protrudes around the edge of the opening, resulting in disconnection of a wiring.

In the method, it is preferable that the cutting instrument is either a needle or a flat-blade knife. In the case in which the cutting instrument is a needle, it is possible to produce a contact hole on a conductive film having a fine pattern.

In the method, contact between the electrode or wiring and the cutting instrument can be checked by detecting change in electric constants. The electrical constant may be an ampere, a voltage, a signal waveform of current or voltage, a resistance value, or impedance. That is, it is possible to determine whether the cutting instrument reaches the electrode or wiring by detecting the change in the electric constant.

It is preferable that the cutting instrument may have either a heating element which heats a tip of a blade or a vibrating element which vibrates a tip of the blade. The heating element may be an electric resistance (heater), or a high frequency heating coil. The vibrating element may be an ultrasonic vibrator to which a high frequency driving signal is supplied. By this structure, it is possible to facilitate insertion of the cutting instrument into the insulation layer by heating the tip of the blade, or by breaking the insulation layer by concentrating vibrating energy to the tip of the blade.

The cutting instrument can be made of tungsten, stainless steel, gold, or tantalum. However, material for the cutting instrument is not limited thereto, but other adequate materials can be used.

Surface treatment may be performed in order to prevent material for the insulation layer from sticking the surface of the cutting instrument.

The contact hole forming method may be applied to a circuit board (wiring board) manufacturing method for manufacturing a circuit board (wiring board).

The contact hole forming method may be applied to a semiconductor device manufacturing method for manufacturing a semiconductor device.

A contact hole forming method according to this aspect relates to a contact hole forming method which exposes part of a conductive layer in a semiconductor device having a substrate, the conductive layer formed on the substrate, and an insulation layer formed so as to cover the conductive layer. The contact hole forming method includes a position determining step of placing a cutting instrument on a surface of the insulation layer at a position where a contact hole is to be formed, a step of inserting the cutting instrument into the insulation layer at an angle to the surface of the insulation layer, a step of checking whether the cutting instrument reaches the conductive layer by measuring electric constants of the cutting instrument and the conductive layer and by detecting change in electric constants, a step of stopping insertion of the cutting instrument on the basis of the detection result in the checking step, and a step of drawing out the cutting instrument from the insulation layer.

Thanks to this method, it is possible to form a contact hole by automatically excavating a hole extending to the conductive layer. The angle is in the range from 5° to 80°, and more preferably in the range from 20° to 60°. By setting the angle to be in such range, it is possible to collect residue on one side edge of the contact hole.

In the method, it is preferable that the method includes a step of moving the cutting instrument in lateral direction after stopping insertion of the cutting instrument. With this step, it is possible to increase diameter of the contact hole.

Another aspect of the invention is to provide a contact hole forming method including forming a first conductive film patterned so as to serve as an electrode or a wiring on a substrate, forming an insulation film on the first conductive film and the substrate, bringing a hollow needle having a hollow inside thereof into contact with the first conductive film through the insulation film, stripping off the insulation film in the hollow by lowering a pressure in the hollow of the hollow needle, and removing the stripped insulation film in the hollow so as to form an opening on the first conductive film.

Thanks to the method, it is possible to reduce the amount of residue on the bottom of the opening because the insulation film in the hollow is sucked. Thus, it is possible to suppress electrical conduction failure. Further, it is possible to improve the characteristic of a device having such contact hole.

In the method, light is irradiated onto the insulation film in the hollow through the hollow while the hollow needle is in contact with the first conductive film. Thanks to this method, it is possible to alter (for example, decompose) the insulation film in the hollow and thus it is possible to effectively reduce the amount of residue on the bottom of the opening.

In the method, it is preferable that a dissolving liquid which can dissolve the insulation film is introduced into the hollow while the hollow needle is in contact with the first conductive film.

In the method, it is preferable that light is irradiated onto the insulation film in the hollow in order to alter the insulation film in the hollow and a dissolving liquid which can dissolve the altered insulation film is injected into in the hollow of the hollow needle while the hollow needle is in contact with the first conductive film. Thanks to such method, it is more effectively reduce the amount of residue on the bottom of the opening by altering and decomposing the insulation film in the hollow of the hollow needle.

In the method, it is preferable that the hollow needle is heated while the hollow needle is in contact with the first conductive film. Thanks to this method, it is possible to melt the insulation film (at least part thereof being in contact with the hollow needle) by heat, and thus it is possible to more effectively reduce the amount of residue on the bottom of the opening.

In the method, a checking process of checking electrical conduction state between the first conductive film and a conductive member by bringing the conductive member into contact with the bottom of the opening through the hollow of the hollow needle is performed. Thanks to this method, it is possible to prevent electrical conduction failure from occurring.

It is preferable that the hollow of the hollow needle is rinsed using a dissolving liquid which can dissolve the insulation film after forming the opening. Thanks to this method, it is possible to remove the residue (including dissolved or altered insulation film residue) attached to the inner surface of the hollow needle.

The insulation film may be made of an organic material. Thanks to the method, it is possible to form a contact hole in the insulation film made of an organic material without using a photolithography process.

A wiring board manufacturing method according to this aspect includes the above-mentioned contact hole forming method and a step of forming a second conductive film on the insulation film and in the opening.

Thanks to this method, it is possible to suppress interconnection failure between the first conductive film and the second conductive film. Accordingly, it is possible to improve the characteristic of the wiring board.

A semiconductor device manufacturing method according to this aspect includes the above-mentioned contact hole forming method and a step of forming an organic semiconductor film at a position under the insulation film.

Thanks to the method, it is possible to suppress electrical conduction failure in the contact hole. Further, it is possible to form the contact hole without using a photolithography process, thereby preventing the organic semiconductor film from deteriorating by exposure.

A semiconductor device manufacturing method according to this aspect includes the above-mentioned contact hole forming method and a step of forming a transistor having an organic semiconductor film formed under the insulation film as part thereof.

Thanks to the method, it is possible to lower a failure rate of electrical conduction in the contact hole. Further, it is possible to form the contact hole without using a photolithography process and thus it is possible to prevent the characteristic of the transistor from deteriorating by exposure.

An electro-optical device manufacturing method according to this aspect includes the semiconductor device manufacturing method. Thanks to this method, it is possible to improve the characteristic of the electro-optical device.

Further aspect of the invention is to provide a method of forming a contact hole including forming a first conductive film patterned so as to serve as an electrode or a wiring on a substrate, forming an insulation film on the first conductive film and the substrate, bringing a double hollow needle including first needle having a first hollow and a second needle having a second hollow surrounding the first needle into contact with the first conductive film through the insulation film, and injecting a dissolving liquid which can dissolve the insulation film into the first hollow and sucking dissolved insulation film through the second hollow, or injecting the dissolving liquid which can dissolve the insulation film into the second hollow and sucking dissolved insulation film through the first hollow.

According to this method, the insulation film in the hollow of the hollow needle is dissolved and sucked. Accordingly, it is possible to decrease the amount of residue on the bottom of the opening. Thus, it is possible to decrease a failure rate of electrical conduction in the contact hole. Further, it is possible to improve the characteristic of a device having the contact hole.

According to this aspect, provided is a method of forming a contact hole including forming a first conductive film patterned so as to serve as an electrode or a wiring on a substrate, forming an insulation film on the first conductive film and the substrate, bringing a double hollow needle including first needle having a first hollow and a second needle having a second hollow surrounding the first needle into contact with the first conductive film through the insulation film, and introducing a decomposing gas which can decompose the insulation film into the first hollow and sucking decomposed insulation film through the second hollow, or introducing the decomposing gas which can decompose the insulation film into the second hollow and sucking the decomposed insulation film through the first hollow.

According to this aspect, the insulation film in the hollow is decomposed and then sucked. Accordingly, it is possible to decrease the amount of residue on the bottom of the opening. Thus, it is possible to decrease a failure rate of electrical conduction in the contact hole. Further, it is possible to improve the characteristic of a device having the contact hole.

In the method, it is preferable that a tip of the first needle is distanced from a tip of the second needle inside the second needle by a predetermined distance. Thanks to this method, it is possible to effectively supply the dissolving liquid or the decomposing gas through the first needle (first hollow).

In this method, it is preferable that a thickness of the insulation film is smaller than the predetermined distance. Thanks to this method, it is possible to effectively supply the dissolving liquid or the decomposing gas to a surface of the insulation film through the first needle (first hollow) or the second needle (second hollow).

In this method, it is preferable that the decomposing gas is an oxidizable gas. Thanks to this method, it is possible to decompose the insulation film by the oxidizable gas.

In this method, it is preferable that the decomposing gas is irradiated with ultraviolet rays while it is introduced through the first hollow or the second hollow. Thanks to this method, decomposition of the insulation film is promoted by UV rays.

In this method, it is preferable that the decomposing gas is oxygen and ozone is generated from the oxygen by the UV radiation. Thanks to this method, decomposition of the insulation film is promoted by the UV rays and ozone.

In this method, it is preferable that the insulation film is made of an organic material. According to this method, it is possible to form a contact hole in the insulation film made of the organic material without using a photolithography process.

After the opening is formed, the second needle or a conductive member is brought into contact with the bottom of the opening and contact between the first conductive film and the second needle or between the first conductive film and the conductive member is checked. Thanks to this method, it is possible to further decrease a failure rate of electrical conduction in the contact hole.

A wiring board manufacturing method according to this aspect includes the contact hole forming method and a step of forming a second conductive film on the insulation film and in the opening.

Thanks to the method, it is possible to decrease a failure rate of interconnection of the first conductive film and the second conductive film. Accordingly, it is possible to improve the characteristic of the wiring board.

A semiconductor device manufacturing method according to this aspect includes the contact hole forming method and a step of forming an organic semiconductor film under the insulation film.

Thanks to this method, it is possible to decrease a failure rate of electrical conduction in the contact hole. Further, since it is possible to form the contact hole without using a photolithography process, it is possible to prevent the organic semiconductor film from deteriorating by exposure.

A semiconductor device manufacturing method according to this aspect includes the contact hole forming method and includes a step of forming a transistor having an organic semiconductor film disposed under the insulation film as part thereof.

Thanks to this method, it is possible to decrease a failure rate of electrical conduction in the contact hole. Further, since it is possible to form the contact hole without using a photolithography process, it is possible to prevent the organic semiconductor film from deteriorating by exposure.

An electro-optical device manufacturing method according to this aspect includes the semiconductor device manufacturing method. Thanks to this method, it is possible to improve the characteristic of the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

First Embodiment

Figure 1A:
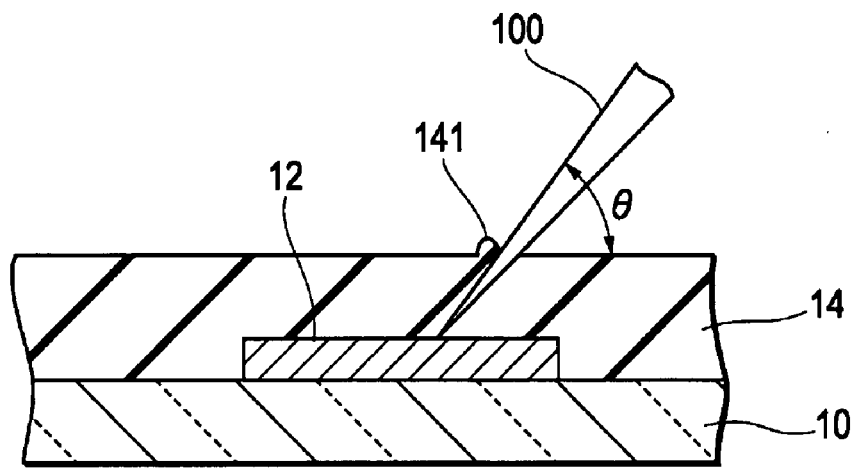
FIGS. 1A to 1C are explanatory views illustrating a method of forming a contact hole according to a first embodiment.
Figure 1B:
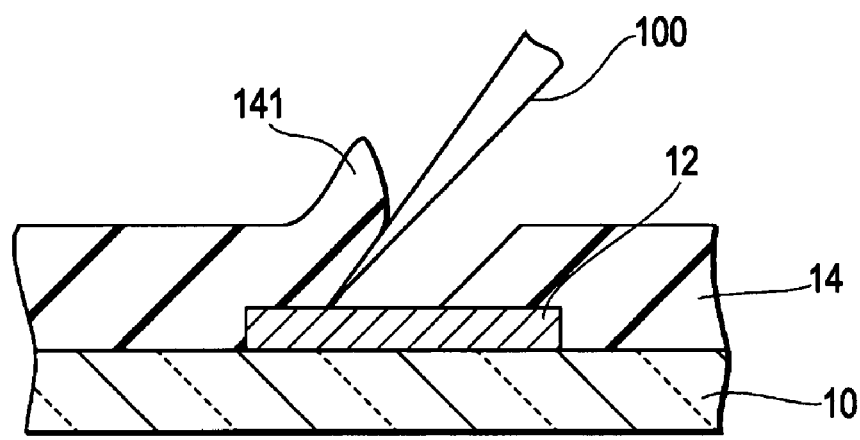
Figure 1C:
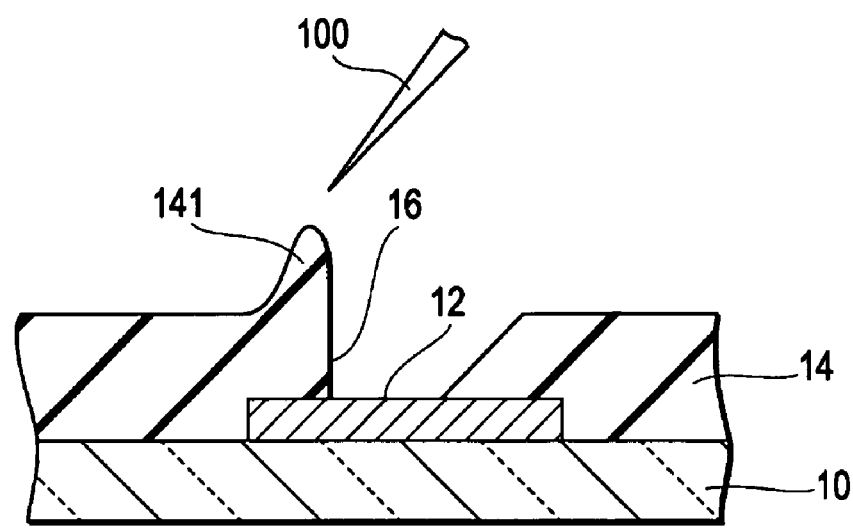
Figure 2A:
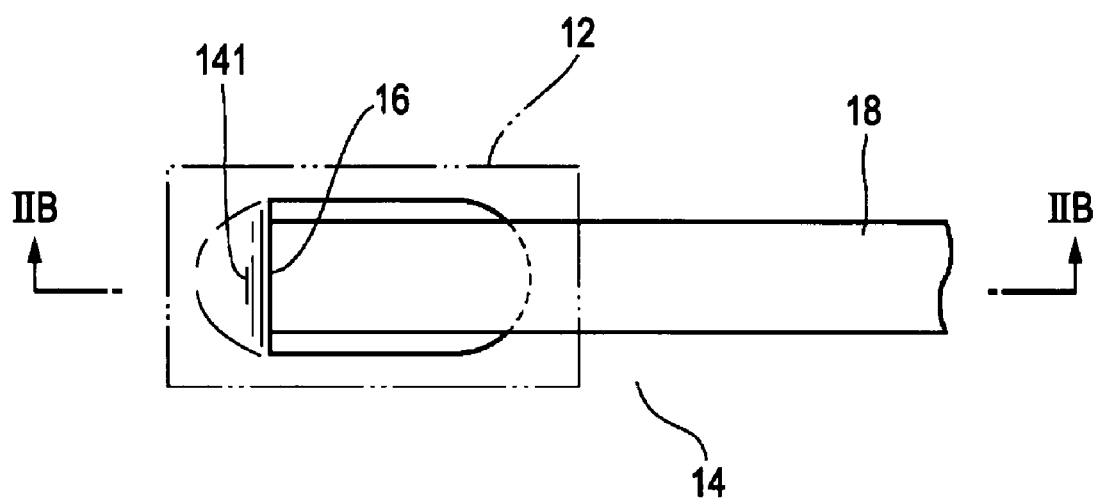
FIGS. 2A to 2B are explanatory views illustrating a method of forming a contact hole according to the first embodiment.
Figure 2B:
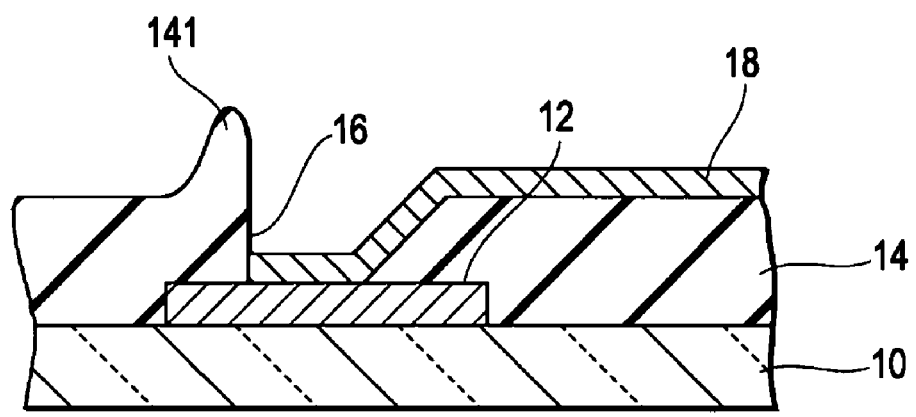

FIGS. 1A to 1C are sectional views illustrating a method of forming a contact hole according to the invention. FIG. 2A is a plan view illustrating the method of forming a contact hole according to the invention, and FIG. 2B is a sectional view taken along line IIB-IIB' shown in FIG. 2A.

As shown in FIG. 1A, an electrode•wiring 12 made of a first conductive film (metal film) is formed on an insulation substrate 10 such as a glass substrate and then is covered with an insulation layer 14. In the case of using a plastic substrate as the substrate 10, the substrate 10 may be made of polyethylene terephthalate (PET), polycarbonate, acryl, or the like. For example, the substrate 10 serving as a plastic base has a bending elasticity of 2000 to 4000 MPa. The relatively hard plastic base has relatively wide application. The electrode•wiring 12, for example, is formed by forming a film by depositing or sputtering a metal such as aluminum and patterning the metal. The insulation layer 14 is formed by a spin-coating method using insulation polymer which will be described below.

A needle (cutting instrument) 100 is inserted into the insulation layer 14 formed through the above processes in a tilt direction at an angle θ to the surface of the insulation layer 14. In a first embodiment, the needle 100 is referred to as a cutting instrument.

If the angle θ to the surface of the insulation layer 14 is set to be in the range from 5° to 80°, residue 141 of the insulation layer 14 remains at a position on the forward side edge (in moving direction) of the cutting instrument 100. When the angle θ is set to be in the range from 20° to 60°, it is possible to make a cut hole (insertion hole) almost vertical while collecting the residue 141 of the insulation layer 14 on one side edge (on the forward side edge in the moving direction) of the cutting instrument 100 and suppressing residue generation on the back side edge (in the moving direction) of the cutting instrument 100. When the cutting instrument 100 arrives at the electrode•wiring 12, insertion of the cutting instrument 100 is stopped. The checking of whether the cutting instrument 100 reaches the electrode•wiring 12 can be performed on the basis of change in electric constants between the cutting instrument 100 and the electrode•wiring 12 as described later. Alternatively, the insertion of the cutting instrument 100 may be stopped when the cutting instrument 100 bumps against the electrode•wiring 12 by using a spring which applies a force against to the cutting instrument 100 advancing toward the electrode•wiring 12 and which stops the cutting instrument 100 from penetrating the electrode•wiring 12.

Next, as shown in FIG. 1B, a leading edge of the cutting instrument 100 is moved in a lateral direction (extension direction of the electrode•wiring) on the electrode•wiring 12. The moving distance of the leading edge of the cutting instrument 100 is, for example, in the range from 10 to 50 μm, but the moving distance may be set so as to correspond to the diameter of a contact hole. By this method, the insulation layer 14 is removed and the insertion hole is increased.

As shown in FIG. 1C, the cutting instrument 100 is drawn upward so as to scrape the residue 141. As a result, a contact hole 16 which is formed by expansion of an insertion hole (cut hole) of the cutting instrument 100 is obtained.

Through these processes, a contact hole is formed in a circuit board.

Alternatively, the cutting instrument 100 may be inserted into the insulation layer 14 at an angle and drawn out without movement in the lateral direction.

As shown in FIG. 2, an electrode•wiring 18 of a second conductive layer is formed on the inclined surface of the contact hole 16, on one side of the contact hole 16 opposite the side with the residue 141. The electrode•wiring 18 is connected to the electrode•wiring 12 in the contact hole 16 and to electrodes or other circuits (not shown) on the insulation layer 14. The electrode•wiring 12 can be formed, for example, by a liquid ejection (ink jet) method.

In the liquid ejection method, it is possible to eject a conductive material at a predetermined position on an insulation layer 32 by actions of a liquid ejection head (ink jet head) (not shown) and a transferring mechanism (not shown) which moves the liquid ejection head (not shown) relative to a substrate 20. Upon moving the liquid ejection head relative to the substrate 20, a conductive pattern (the electrode•wiring 18) is formed on a brim of the contact hole 16 on the side edge without the residue 141.

The pattern of liquid ejection is generated based on electronic data such as bit-map pattern recorded in a liquid ejection device. Accordingly, it is possible to coat a liquid material at a desired position by a simple manner of producing electronic data. The liquid material may include an aqueous dispersion of polyethylenedioxythiophene (PEDOT). Further, a metal colloid can be used as the liquid material. The aqueous dispersion contains water as a main component, but droplets of a liquid to which alcohol is added may be used to form contacts.

Figure 14:
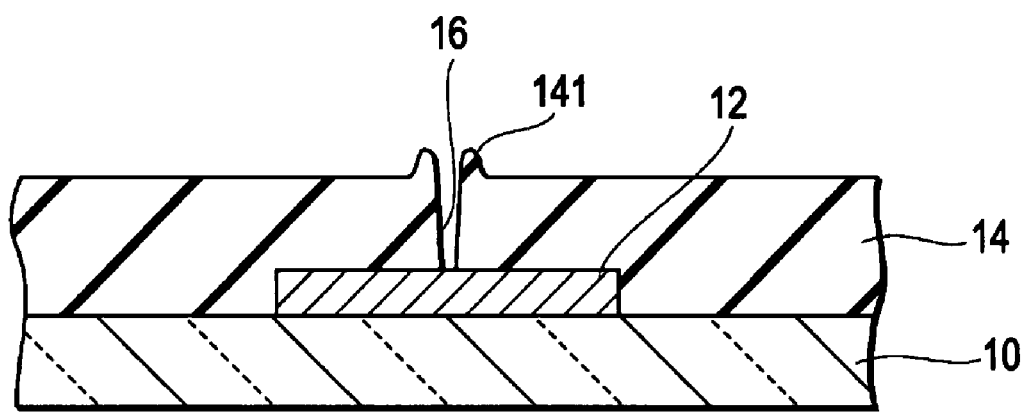
FIG. 14 is an explanatory view illustrating a method forming a contact hole according to a comparative example.

FIG. 14 shows a comparative example. Like elements in FIG. 1 and FIG. 14 are denoted by like reference numbers and explanation of the elements is omitted.

In the comparative example, the cutting instrument (not shown) is inserted into the insulation layer 14 at a right angle to the surface of the insulation layer 14. In this case, the residue 141 is present along the circumferential edge of an entrance of the contact hole 16. On the other hand, according to the embodiment, as shown in FIGS. 1 and 2, the residue 141 is present on one side of the contact hole 16. Accordingly, it is possible to avoid disconnection of the wiring 18 attributable to the residue 141 by achieving wiring connection using only part of the contact hole on which the residue 141 is not present.

Figure 3:
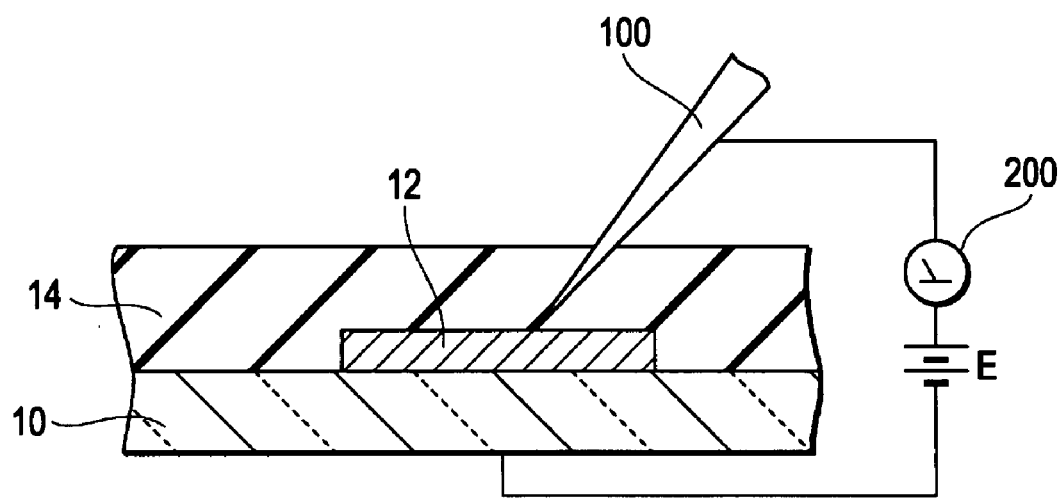
FIG. 3 is an explanatory view illustrating a method of checking whether a cutting instrument is in contact with an electrode or a wiring.

FIG. 3 is an explanatory view for explaining how to check whether the leading edge of the cutting instrument 100 reaches the electrode•wiring 12. In FIGS. 1 and 3, like reference numbers reference like elements, and thus explanation or the like elements is omitted.

As shown in FIG. 3, when the cutting instrument 100 contacts the electrode•wiring 12, a closed electric circuit is formed between the cutting instrument 100 and the electrode•wiring 12. The electric circuit includes a power source E supplying a current to the closed circuit and an electric constant meter 200 which measures an electric constant or detects change in electric constants. The electric constant may be current, voltage, resistance, impedance, voltage•current waveform, or the like. For this instance, the electric constant meter 200 may be an ampere meter, a voltage meter, a resistance meter, an impedance meter, an oscilloscope, or the like. In an electric circuit, the electric constants of the open state and the closed state of the circuit are different from each other. Accordingly, it is possible to determine whether the cutting instrument 100 contacts the electrode•wiring 12 by measuring the electric constant using the electric constant meter 200. The electric constant is adequately selected from the above-mentioned examples. The electric constant meter 200 can be selected from commercial products and thus detailed explanation thereof will be omitted.

Figure 4:
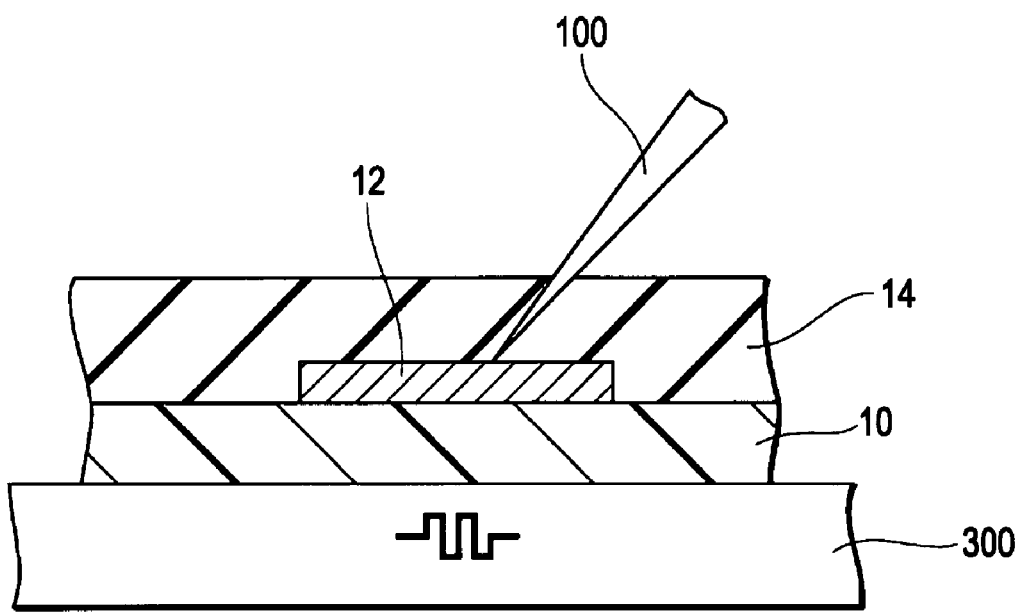
FIG. 4 is an explanatory view illustrating a contact hole forming method in which a substrate is heated while the cutting instrument is inserted in an insulation layer.

FIG. 4 shows an exemplary contact hole forming method in which a substrate 10 is heated while the cutting instrument 100 is inserted in the insulation layer 14. In FIGS. 1 and 4, like reference numbers reference like elements, so that explanation of such elements with reference to FIG. 4 will be omitted.

In this example, an electric heater, a temperature of which can be controlled, is installed in a support 300 on which the substrate 10 is disposed. According to this example, it is possible to facilitate insertion of the cutting instrument into the insulation layer and prevent the insulation layer from cracking due to decreased hardness of the insulation layer 14, which is achieved by heating the substrate 10 when the cutting instrument is inserted into the insulation layer. In addition, when a resin (polymer) substrate is selected as the substrate 10, the substrate 10 becomes flexible by heating, thereby preventing the substrate 10 from cracking when a pressure by the cutting instrument 100 is applied thereto.

Figure 5:
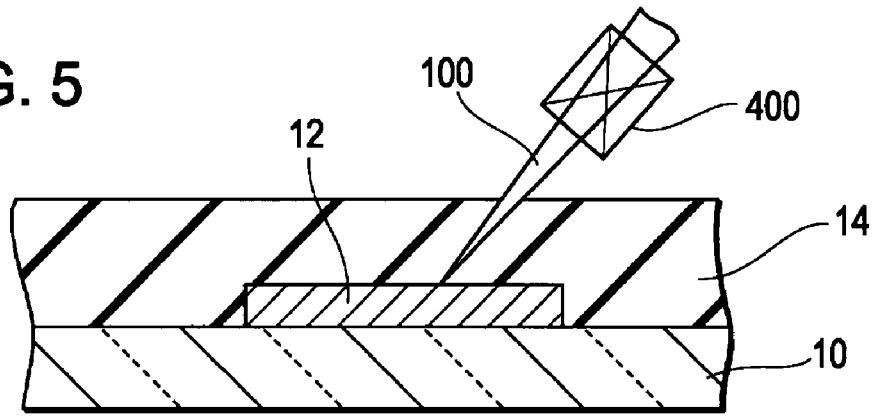
FIG. 5 is an explanatory view illustrating a needle with a heat source serving as a cutting instrument.

FIG. 5 shows another exemplary contact hole forming method in which a heated cutting instrument 100 is used. In FIGS. 1 and 5, like reference numbers reference like elements, so that explanation of such elements with reference to FIG. 5 will be omitted.

As shown in FIG. 5, a heating element (heat source) 400 is installed in the middle of the cutting instrument 100. The heat generated from the heating element 400 can be transferred to the leading end (tip) of the cutting instrument 100. The heat softens the organic insulation layer 14, so that the cutting instrument 100 can be easily inserted into the insulation layer 14. The heat also prevents the insulation layer 14 from cracking. The heating element 400 may be a heat resistor (heater), a high-frequency coil which generates heat by induced current, or the like.

Figure 6:
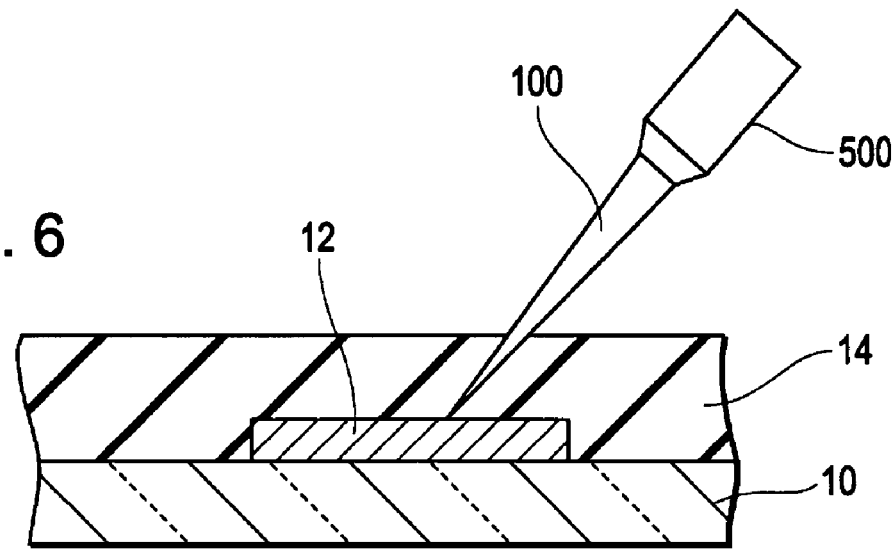
FIG. 6 is an explanatory view illustrating a needle with an ultrasonic vibration source serving as a cutting instrument.

FIG. 6 shows a further exemplary contact hole forming method in which a cutting instrument 100 which performs ultrasonic vibration is used. In FIGS. 1 and 6, like reference numbers reference like elements, so that explanation of such elements with reference to FIG. 6 will be omitted.

As shown in FIG. 6, an ultrasonic vibration element 500 is provided at a rear end of the cutting instrument 100. The ultrasonic vibration generated by the ultrasonic vibration element 500 is transferred through the cutting instrument 100 and concentrates at the tip of the cutting instrument 100, and thus vibration energy is enhanced. The cutting instrument 100 forms a contact hole not only by cutting the insulation layer 14 by the sharp edge of a knife but also by breaking the insulation layer 14 by micro-vibration of the edge of the knife.

Figure 7:
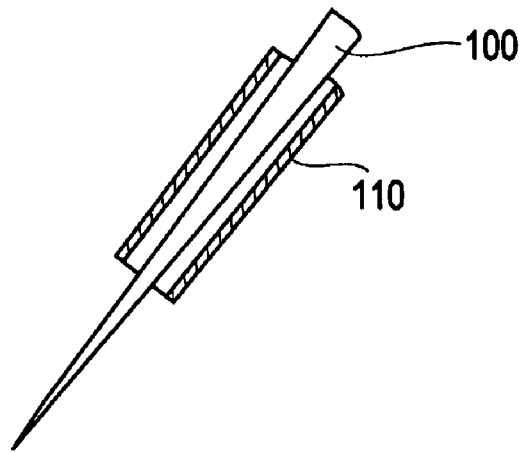
FIG. 7 is an explanatory view illustrating a needle with a suction passage serving as a cutting instrument.

FIG. 7 shows a further exemplary contact hole forming method in which a cutting instrument having a suction passage through which residue is sucked is used. In this example, a needle-shaped cutting instrument 100 is received in a cylindrical body with a suction passage 110 therebetween. The residue is sucked near the leading edge of the cutting instrument 100 and moves through the suction passage 110 toward a rear end portion (not shown) of the cutting instrument 100. Since the residue is removed, it is possible to prevent the residue from protruding along the circumferential edge of the entrance of the contact hole.

Figure 8A:
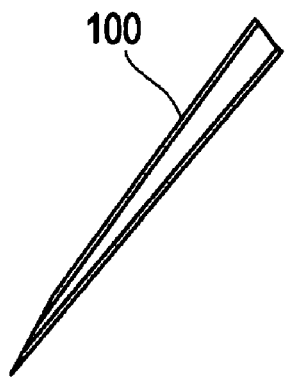
FIGS. 8A to 8C are explanatory views illustrating a hollow needle serving as a cutting instrument.
Figure 8B:
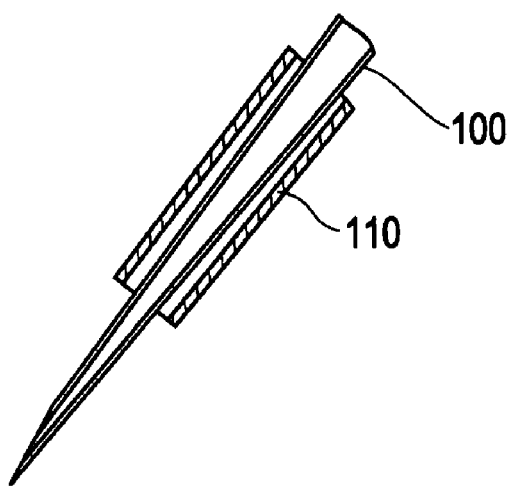
Figure 8C:
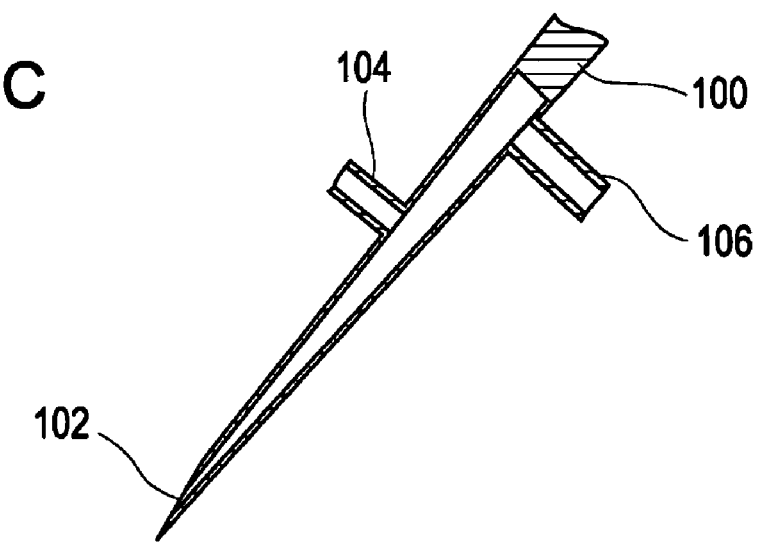

FIGS. 8A to 8C show examples in which a hollow needle is used as the cutting instrument 100.

FIG. 8A shows an example of the cutting instrument 100 in which the cutting instrument has an opening at a tip thereof like an injection needle. In the case of using the hollow needle as the cutting instrument 100, a solvent for dissolving the organic insulation film is discharged from the tip of the cutting instrument 100, and thus the cutting instrument 100 can be easily inserted into the insulation film and it is possible to form a relatively large insertion hole.

FIG. 8B shows another example of the cutting instrument 100 in which the cutting instrument 100 has a hollow needle structure and a suction passage 110. According to this example, the organic insulation film is dissolved by the solvent being discharged out from the tip of the cutting instrument 100 and the residue and excessive solvent are sucked and removed through the suction passage 110. By use of the cutting instrument 100 according to this example, it is possible to achieve smooth insertion of the cutting instrument into the organic insulation film and residue removal.

FIG. 8C shows an example in which the cutting instrument 100 having a hollow needle structure is used to supply a solvent and remove the residue. The cutting instrument 100 is provided with an opening 102 at the tip thereof, and with a solvent supply opening 104 and a residue discharge opening 106 in a midway portion in the lengthwise direction of the cutting instrument 100. The solvent supply opening 104 and the residue discharge opening 106 are equipped with corresponding cutoff valves (not shown). When discharging out the solvent from the opening 102 at the tip of the cutting instrument 100, the valve for the solvent supply opening 104 is opened and the valve for the residue discharge opening 106 is closed. In this state, the solvent flows to the opening 102 from the solvent supply opening 104. Conversely, when sucking the residue through the opening 102 at the tip of the cutting instrument 100, the valve for the solvent supply opening 104 is closed and the valve for the residue discharge opening 106 is opened. In this state, the residue and the excessive solvent are sucked through the opening 102 at the tip of the cutting instrument 100 and discharged through the residue discharge opening 106. When inserting the cutting instrument 100 into the insulation film, a step of discharging out the solvent and a step of sucking and discharging the excessive solvent and the residue are repeatedly alternately performed. As a result, it is possible to enable smooth insertion of the cutting instrument 100 and reduce the amount of residue.

Figure 9A:
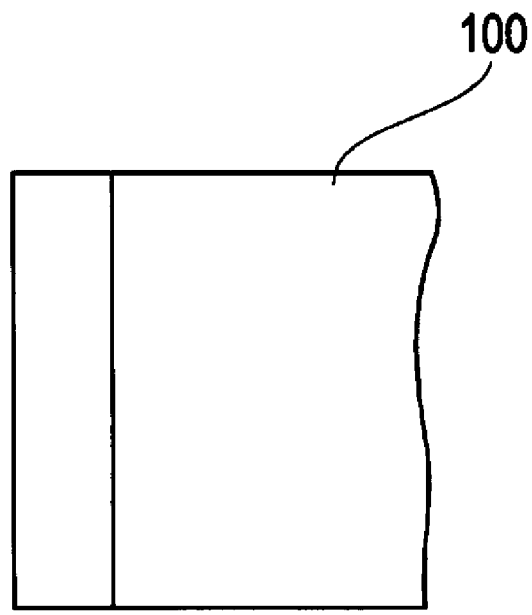
FIGS. 9A to 9B are explanatory views illustrating a flat-blade knife serving as a cutting instrument.
Figure 9B:
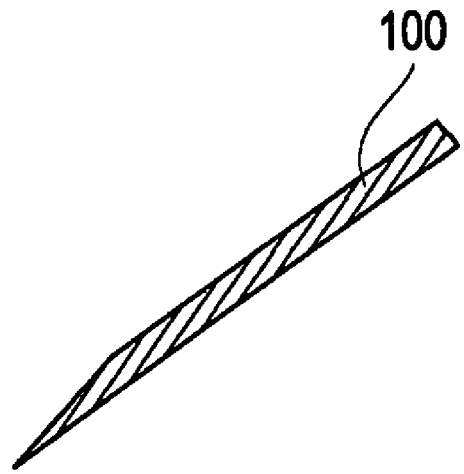

FIGS. 9A and 9B show an example of the cutting instrument 100 in which the cutting instrument is a flat-blade knife. FIG. 9A is a plan view and FIG. 9B is a side view illustrating the flat-blade knife.

In the case of forming contact holes on a plurality of electrodes arranged on a substrate, the contact holes are arranged in a straight line. In this case, it is possible to form the contact holes on the plurality of electrodes at one trial of insertion of the cutting instrument 100 into the organic insulation layer by using the cutting instrument 100 which is a flat-blade knife with a straight line edge.

Figure 10A:
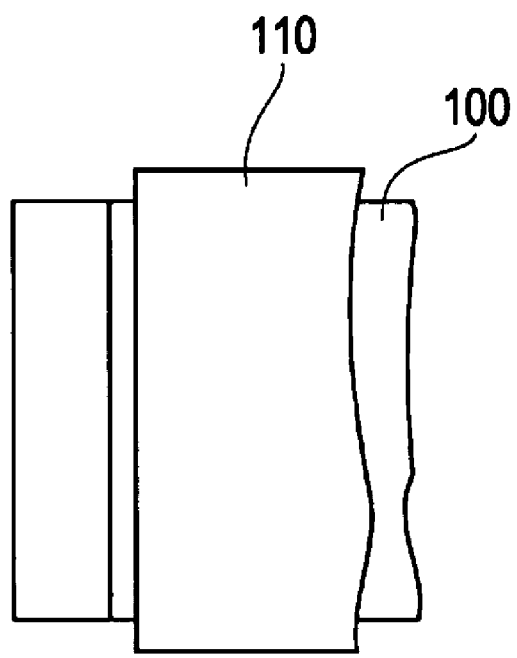
FIGS. 10A to 10B are explanatory views illustrating a flat-blade knife with a suction passage serving as a cutting instrument.
Figure 10B:
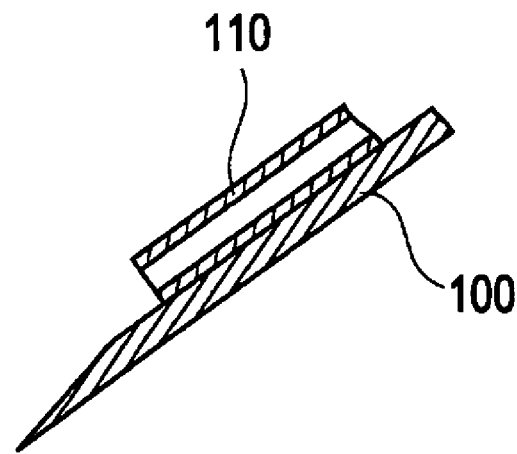

FIGS. 10A and 10B show an example of the cutting instrument 100 in which the cutting instrument 100 is a flat-blade knife with a suction passage. FIG. 10A is a plan view and FIG. 10B is a partial sectional view illustrating the flat-blade knife. The cutting instrument 100 is inserted into the insulation layer at a slant with respect to the surface of the insulation layer and thus residue gathers on the upper side of the flat-blade knife. The residue is sucked through the suction passage 110 disposed at an upper portion of the flat-blade knife and moves toward a rear end of the cutting instrument 100.

FIGS. 11A to 11F are explanatory views illustrating a semiconductor device manufacturing method using the—mentioned contact hole forming method.

Figure 11A:
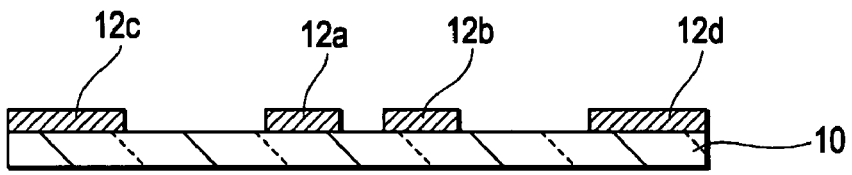
FIGS. 11A to 11F are explanatory views illustrating a semiconductor device manufacturing method using the contact hole forming method according to the first embodiment.

As shown in FIG. 11A, aluminum is deposited on an insulation substrate 10 by a sputtering method so as to form a metal film, and then the metal film is patterned by a photolithography process so as to form an electrode•wiring 12 including a source electrode 12a, a drain electrode 12b, and wirings 12c and 12d.

Figure 11B:
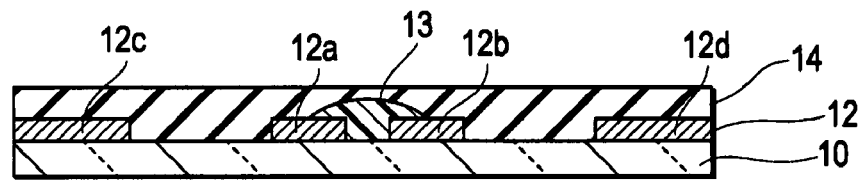

As shown in FIG. 11B, an organic semiconductor material is applied between the source electrode 12a and the drain electrode 12b by a liquid ejection method so as to form a semiconductor layer 13. The organic semiconductor material may be an organic semiconductor material with a low molecular weight, such as naphthalene, anthracene, tetracene, pentacene, hexacene, phthalocyanine, perylene, hydrazone, triphenylmethane, diphenylmethane, stilbene, arylvinyl, pyrazoline, tri-penylamine, tri-arylamine, okogothiophene, phthalocyanine, or their derivates; or an organic semiconductor material with a high molecular weight, such as poly-N-vinylcarbazole, polyvinylpyrene, polyvinylantracene, polythiophene, polyhexylthiophene, poly(p-penylenevinylene), polythinylenevinylene, polyarylamine, pyreneformaldehyde resin, ethylcarbazoleformaldehyde resin, fluorene-bithiophene copolymer, fluorenearylamine copolymer, or their derivatives. Alternatively, the organic semiconductor material may be a combination of two or more components selected from the group described above. Further, it is preferable that the organic semiconductor material is a high molecular weight polymer.

Next, an organic insulation material is coated over the substrate 10 by a spin coating method so as to form an insulation layer 14. The organic insulation material may be polyvinyl phenol or phenol resin (also called novolac resin). In addition, acryl-based resin including poly methyl methaacrylate, PC, polystyrene, polyolefin, polyimide, fluorine-based resin, or the like can be used as the organic insulation material.

In the case of forming the insulation layer 14 by coating a solution, it is required that a solvent in the solution for forming the insulation layer 14 does not swell or dissolve the semiconductor layer 13 or the substrate 10. In the case in which the semiconductor layer 13 is made of a material which can be dissolved in the solvent, the insulation layer forming process must be performed with a great deal of caution. Since the semiconductor layer 13 is made of a conjugative molecular or a conjugative polymer including an aromatic ring, the semiconductor layer 13 can be easily dissolved in aromatic hydrocarbons. Accordingly, it is preferable that the insulation layer 14 is formed using hydrocarbons other than aromatic hydrocarbons or organic solutions, for example, ketone-based, ether-based, or ester-based organic solutions. In addition, it is preferable that the insulation layer 14 is insoluble in a liquid material for forming a gate electrode 18 which will be described below. In order to improve wettability and contact angle to the gate electrode or wiring 18 to be formed in the subsequent step, it is preferable that an absorbing layer (not shown) is formed on the insulation layer 14.

Figure 11C:
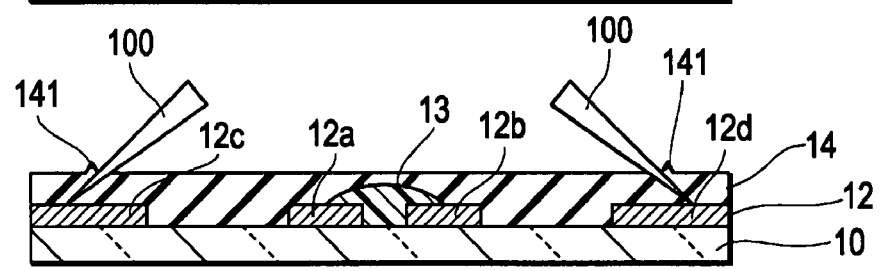

Next, as shown in FIG. 11C, a contact hole is formed in the insulation layer 14. The contact hole formation is achieved by using the cutting instrument 100 to cut the insulation layer 14 at an angle with respect to the electrodes 12c and 12d as described above.

The angle of the cutting instrument with respect to the electrodes 12c and 12d is in the range from 20° to 50°, but may be in the range from 5° to 80°. The angle is set so as to suppress the amount of residue to the minimum according to the quality of the material, film thickness, and temperature of the insulation layer, and other conditions. The insertion direction of the cutting instrument 100 is set so as to correspond to a contact direction of the wiring 18 which will be described below. With such setting, the residue gathers on a first side edge of the contact hole, which is opposite a second side edge of the contact hole, on which the wiring 18 is to be formed.

Figure 12:
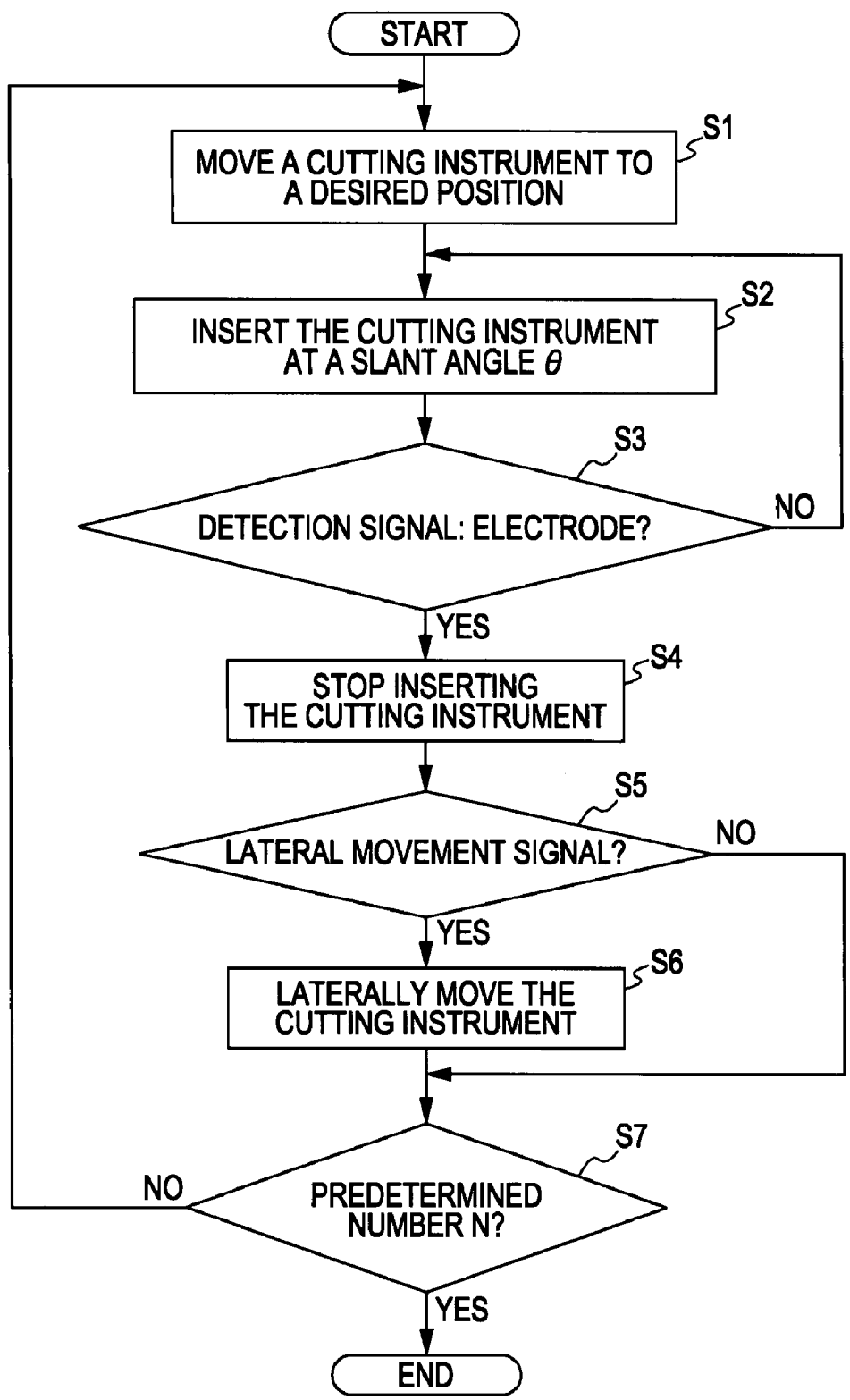
FIG. 12 is a flow chart illustrating sequential flow of the contact hole according to the first embodiment.

FIG. 12 is a flow chart showing the sequence of a method of forming a contact hole.

The contact hole formation (see FIGS. 11C and 11D) is controlled by a contact hole forming apparatus (not shown). Here, operation of the contact hole forming apparatus according to one embodiment will be described.

In Step S1, the cutting instrument 100 is arranged at a position where a contact hole is to be formed on the insulation layer 14. Such arrangement of the cutting instrument 100 is achieved in a manner such that a computer system of the contact hole forming apparatus moves the cutting instrument 10 relative to the substrate 10 based on the wiring pattern and the contact hole position recorded in a storage device thereof.

In Step S2, as shown in FIG. 11C, the cutting instrument 100 is inserted into the insulation layer 14 at an angle $\theta$ to the surface of the insulation layer 14.

In Step S3, it is checked whether the cutting instrument 100 reaches the electrode using the electric constant meter 200. In the case in which the cutting instrument 100 has reached the electrode, Step S4 is performed. Conversely, in the case in which the cutting instrument 100 has not yet reached the electrode, Step S2 is continuously performed. That is, the cutting instrument 100 is inserted deeper.

In Step S4, since the cutting instrument 100 has reached the electrode, insertion of the cutting instrument 100 is stopped.

In Step S5, it is checked whether there is a lateral movement signal for moving the cutting instrument 100 in the lateral direction. When the lateral movement signal is detected, Step S6 is performed. However, when the lateral movement signal is not detected, Step S7 is performed. Generation of the lateral movement signal and distance of the lateral movement can be set by the contact hole forming apparatus.

In Step S6, the cutting instrument 100 is moved in the lateral direction by a predetermined distance. In order to secure formation of the contact hole, it is possible to repeatedly perform the lateral movement of the cutting instrument 100 several times.

In Step S7, it is checked whether a predetermined number of contact holes is formed. When the number of contact holes which are formed is equal to the predetermined number, the contact hole forming process is finished. Conversely, when the number of contact holes which are formed is smaller than the predetermined number, Steps S1 to S7 are performed in order to form another contact hole.

The predetermined number is set by the contact hole forming apparatus. For example, the predetermined number can be determined according to a maintenance period of the cutting instrument 100 or the total number of contact holes to be formed in the substrate 10.

As described above, a variety of kinds of cutting instrument 100 can be used (see FIGS. 5, 6, 7, 8A to 8C, 9A to 9B, and 10A to 10B). Further, the substrate 10 can be heated (see FIG. 4). The above-mentioned examples with reference to FIGS. 4, 5, 6, 7, 8A to 8C, 9A to 9B, and 10A to 10B can be combined in order to form a contact hole.

Figure 11D:
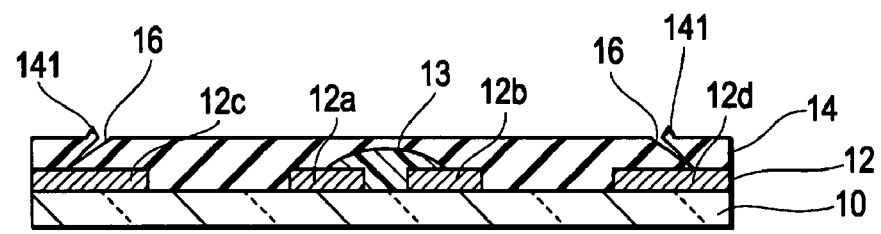

Subsequently, as shown in FIG. 11D, the cutting instrument 100 is drawn out. At this time, the cutting instrument 100 may be drawn out upward at an angle so as to form contact holes 16 having a shape and a size corresponding to those of the cutting instrument 100 or may be drawn out upward in the vertical direction so as to form contact holes 16 having a diameter larger than that of the cutting instrument 100.

Figure 11E:
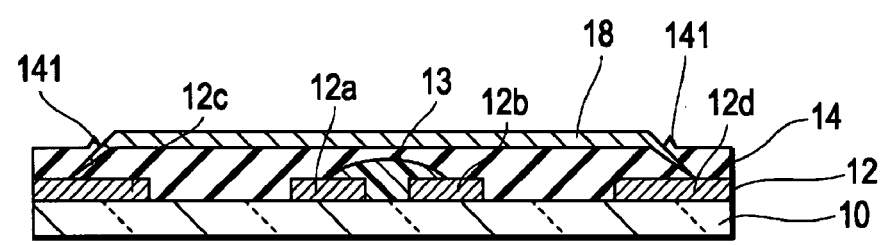

Next, as shown in FIG. 11E, a gate electrode wiring 18 serving as a gate and a wiring is formed. The gate electrode wiring 18 is formed by ejecting a conductive material on the insulation layer 14 disposed between the contact holes 16 by a liquid ejection method. At this time, a liquid ejection head is moved forward and backward so as to fill the contact holes 16 with a conductive material in a direction from one side of the contact hole on which the residue is not present. The conductive material can be, for example, a metal particulate dispersion or polyethylenedioxythiophene (PEDOT) aqueous dispersion.

Figure 11F:
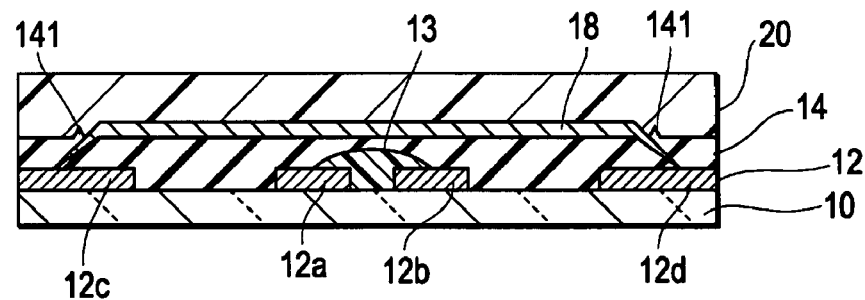

Next, as shown in FIG. 11F, an organic insulation material is coated over the entire surface of the substrate by a spin coating method so as to form a protective layer 20. The organic insulation material can be, for example, polyvinyl phenol, phenol resin (also called novolac resin), polymethyl metaacrylate, or the like.

Thus, the semiconductor device is completed.

As described above, according to this embodiment, a cutting instrument (for example, needle) is inserted into a target layer in which a contact hole is to be formed at a slant, so that a slanted contact hole is formed while allowing the residue to be present on only one side of the contact hole. A wiring for connecting a lower part of the contact hole to another part is formed using one side edge of the contact hole, on which the residue does not exist. Accordingly, it is possible to avoid disconnection of the wiring attributable to the residue.

FIGS. 13A to 13F are explanatory views for explaining another semiconductor device manufacturing method using the above-mentioned contact hole forming method.

In this embodiment, in order to improve peel property of the insulation layer, the surface of the electrode•wiring in the contact hole undergoes a surface treatment process. The surface treatment is performed to degrade adhesion between the corresponding electrode•wiring and the insulation layer formed thereon. In FIGS. 13A to 13F, like elements shown in FIGS. 11A to 11F reference like reference numbers.

Figure 13A:
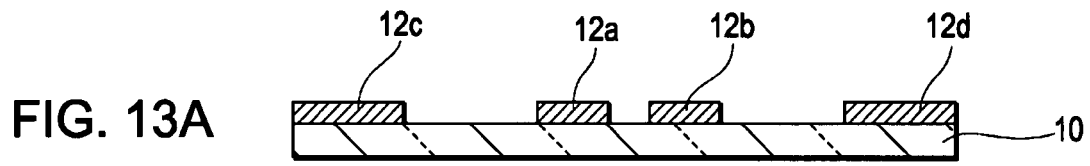
FIGS. 13A to 13F are explanatory views illustrating another semiconductor device manufacturing method using the contact hole according of the first embodiment.

As shown in FIG. 13A, aluminum is deposited on the insulation substrate 10 so as to form a metal layer by a sputtering method, and the metal layer is patterned so as to form electrode•wirings 12 including source electrodes 12a, drain electrodes 12b, and wirings 12c and wirings 12d.

Figure 13B:
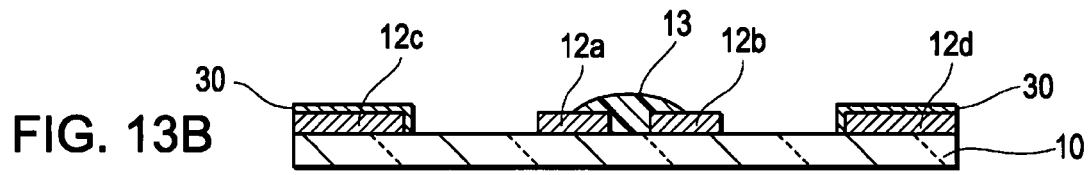

As shown in FIG. 13B, a surface treatment process is performed with respect to wirings 12c and 12d so as to form a removal-promoting layer 30. The surface treatment is performed by coating photoresist (not shown) on a substrate by a spin coating method, exposing the photoresist using a mask with a pattern, and developing the photoresist so as to expose the wirings 12c and 12d at positions where contact holes are to be formed. Next, the surface of the exposed wirings 12c and 12d is treated with plasma using fluorine-based gas $CF_4$ by a plasma chemical vapor deposition (CVD) apparatus so that a fluorine compound is provided to the surface of the wirings 12c and 12d. Then, the mask is removed and thus the substrate with fluorine treated portions 30 on the wirings 12c and 12d is obtained.

Alternatively, a Fluorine-contained Self Assemble Monolayer (F-SAM) film containing a functional group (fluorine) which has low adhesion with polymer may be formed through the surface treatment. For example, thiol compound expressed by $Dam(CF_2).n(CH_2).l.S$—OH (m, n, l are natural numbers, respectively) can be used. The thiol compound is easily chemically absorbed into the surface of gold used as electrodes and wirings and thus forms a dense and hard ultrathin-film (monomolecular film).

Figure 13C:
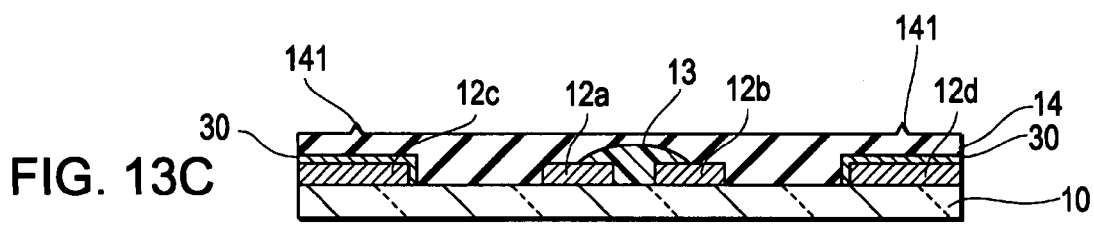

Next, as shown in FIG. 13C, an organic semiconductor material is applied between the source electrode 12a and the drain electrode 12b by a liquid ejection method so as to form a semiconductor layer 13. Examples of the organic semiconductor material are the same as described above.

Next, an insulation layer 14 is formed over the substrate 10 by coating an organic insulation material by a spin coating method. Examples of the organic insulation material are the same as described above. In addition, an absorbing layer (not shown) which is described above is optionally formed on the insulation layer 14 if it is necessary.

Figure 13D:
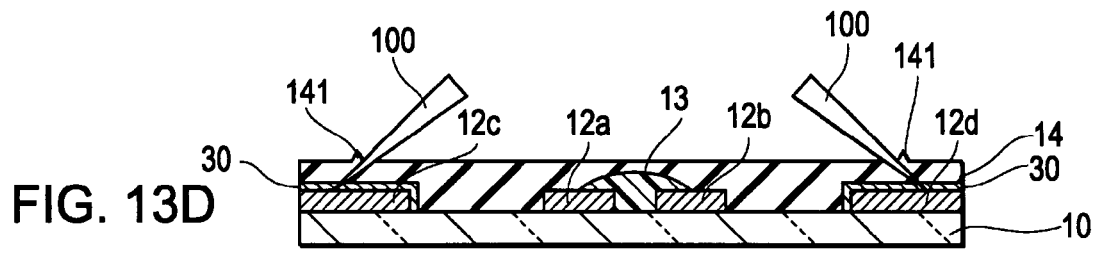

Next, as shown in FIG. 13D, contact holes are formed in the insulation layer 14. Contact hole formation is performed by inserting the cutting instrument 100 into the insulation layer 14 at an angle to the surface of insulation layer 14 toward the electrode•wirings 12c and 12d.

As described above, the angle of the cutting instrument 100 with respect to the surface of the insulation layer 14 is determined according to the quality of material, film thickness, film temperature, and other conditions of the insulation layer 14 so as to suppress the residue to the minimum amount. An insertion direction of the cutting instrument 100 is set so as to correspond to a direction in which the wiring 18 to be described later is formed. Accordingly, the residue 141 being present around the edge of the contact hole is gathered on a first side edge of the contact hole, which is opposite to a second side edge where the wiring 18 is to be formed.

The cutting instrument 100 is controlled by the above-described contact hole forming apparatus (not shown). The contact hole forming apparatus performs position determination of the cutting instrument 100 by moving the cutting instrument relative to the substrate 10 based on the wiring pattern and contact hole positions of which information is stored in a storage device by a computer system. Next, the contact hole forming apparatus inserts the cutting instrument 100 into the insulation layer 14 at a predetermined angle θ. Next, the contact hole forming apparatus checks whether the cutting instrument 100 penetrates through the insulation layer 14 and the surface treatment layer 30 and reaches the electrode•wirings 12c and 12d by using the above-mentioned electric constant meter 200. At this time, the contact hole forming apparatus stops insertion of the cutting instrument 100 and moves the cutting instrument 100 in lateral direction according to circumstances so as to increase size of the contact hole.

Through the above-described processes, the contact holes can be completed.

In this embodiment, the above-described various cutting instruments can be used (see FIGS. 5, 6, 7, 8A to 8C, 9A to 9B, and 10A to 10B), the substrate 10 can be heated (see FIG. 4), and those can be combined.

Figure 13E:
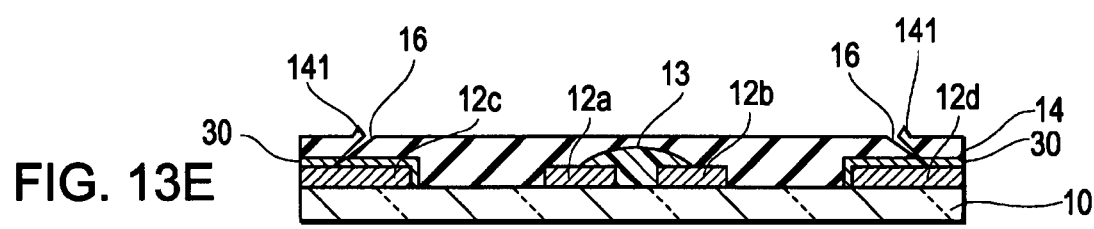

Next, as shown in FIG. 13E, the cutting instrument 100 is drawn out. At this time, the cutting instrument 100 is drawn at an angle so as to form the contact holes 16 having diameter corresponding to that of the cutting instrument 100. Alternatively, the cutting instrument 100 may be drawn in the vertical direction so as to form the contact holes 16 having diameter larger than that of the cutting instrument 100.

Figure 13F:
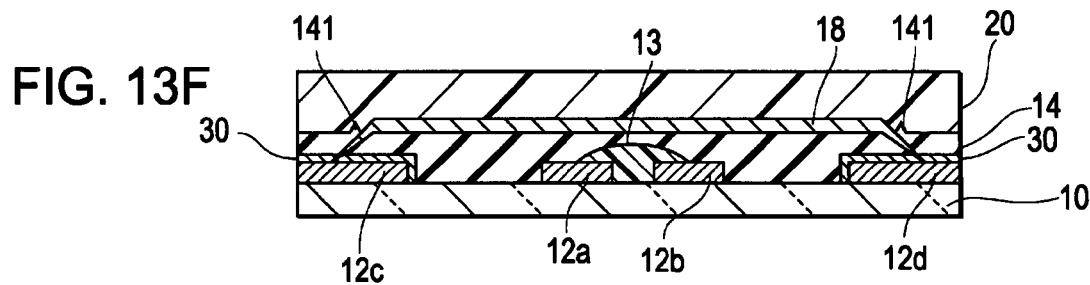

Next, as shown in FIG. 13F, a gate electrode wirings 18 serving as a gate and a wiring is formed. The gate electrode wiring 18 is formed by ejecting a conductive material on the insulation layer 14 between the contact holes 16 by a liquid ejection method. At this time, a liquid ejection head is moved forward and backward so as to fill the contact holes 16 with a conductive material from a side of the contact hole, on which residue is not present. The conductive material can be a metal particulate dispersion or PEDOT aqueous dispersion.

Next, an organic insulation material is coated over the entire surface of the substrate by a spin coating method so as to form a protective layer 20. The organic insulation material can be, for example, polyvinyl phenol, phenol resin (also called novolac resin), poly methyl methaacrylate, or the like.

As a result, a semiconductor device is produced.

The above-described embodiment not only has advantages of the embodiment shown in FIGS. 11A to 11F but also has further advantage in which since the surface of the electrode wiring on which the contact hole is formed is pre-treated and thus adhesion between the electrode wiring and the insulation layer (polymer) is degraded, it is possible to easily remove the insulation layer by the cutting instrument.

In addition, since the electrode wiring on which the contact hole is formed is made of a precious metal, such as gold, platinum, palladium, or the like which is hardly oxidizable, or the surface of the electrode wiring is coated with such precious metal, it is possible to degrade adhesion between the electrode wiring and an organic material (polymer) layer.

The invention is not limited to the above-described embodiments but a variety of modifications may be applied to the above-described embodiments in the scope of the invention without departing from the spirit of the invention.

For example, in each embodiment above, it is possible to reduce the amount of residue by properly selecting a cutting instrument of the various cutting instruments shown in FIGS. 5, 6, 7, 8A to 8C, 9A to 9B, and 10A to 10B. Examples described with reference to FIGS. 3 (checking contact) and 4 (heating substrate) may be added. Needless to say, such examples and embodiments may be adequately combined.

Second Embodiment

Hereinafter, second embodiment of the invention will be described with reference to the accompanying drawings. Elements having the same function are denoted by the same or similar reference symbols, and repetitive description on the same elements will be omitted.

FIGS. 15A to 15C, 16A to 16C, and 17 are process sectional views illustrating a semiconductor device manufacturing method (contact hole forming method).

Figure 15A:
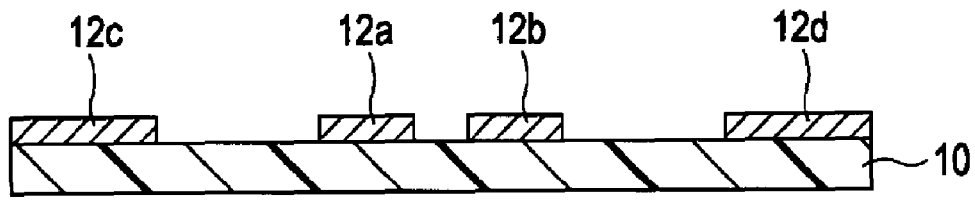
FIGS. 15A to 15C are process sectional views illustrating a semiconductor device manufacturing method (contact hole formation method) according to a second embodiment.

As shown in FIG. 15A, a plastic substrate is prepared as an insulation substrate 10, and conductive films 12a, 12b, 12c, and 12d are formed on the insulation substrate 10. The conductive films 12a, 12b, 12c, and 12d are formed by depositing a metal film (aluminum film) on the insulation substrate 10 by a sputtering method and patterning the metal film. That is, a photoresist film is formed on the aluminum film and then the photoresist film is exposed and developed so as to open regions other than regions on which patterns are to be formed. Next, the aluminum film is etched using the remaining photoresist film serving as an etching mask so as to form the conductive films 12a, 12b, 12c, and 12d. Next, the photoresist film on the conductive films 12a, 12b, 12c, and 12d are removed. Gold Au may be used instead of aluminum Al. Further, a printing method or a mask disposition method may be used instead of the sputtering method.

The conductive films 12a and 12b serve as source electrodes and drain electrodes of organic transistors. The conductive films 12c and 12d also serve as wirings or pads to be connected to gate electrodes of organic transistors.

Figure 15B:
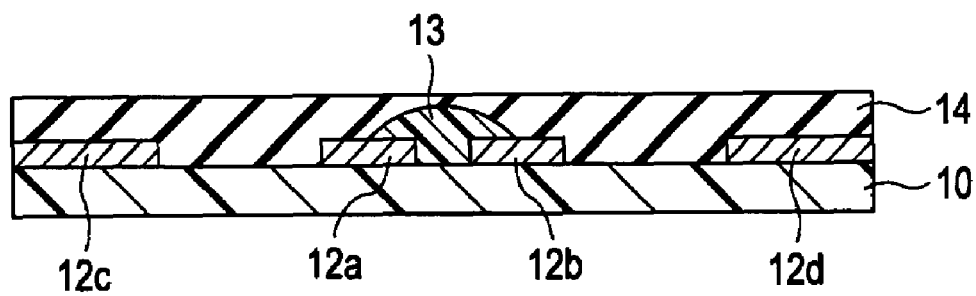

Next, as shown in FIG. 15B, an organic semiconductor film 13 is formed between the conductive films 12a and 12b. The organic semiconductor film 13 is formed by dropping liquid droplets between the conductive films 12 and 12b by a liquid ejection method (ink jet method) using an organic semiconductor material solution and solidifying the liquid droplets.

The organic semiconductor material may be naphathalene, antracene, or the like described in relation with the first embodiment.

By use of such liquid ejection method which selectively ejects liquid droplets at predetermined positions and by the formation of the organic semiconductor film 13, it is possible to omit a patterning process. It is further possible to prevent the organic semiconductor film 13 from deteriorating by exposure. It is still further possible to reduce the amount of photoresist residue generated by high adhesion between the photoresist film and the organic semiconductor material by unnecessary of the photoresist film.

Next, an organic insulation film 14 is formed on the substrate 10 as a insulation film (polymer). The organic insulation film 14 is coated, for example, by a spin coating method using an organic insulation film material solution and solidifying the solution. The organic insulation material can be phenol resin or acryl-basd resin as described in relation with the first embodiment.

In the case of forming the organic insulation film 14 by coating a solution as in the first embodiment 1, it is required that the solution does not swell or dissolve the under layer (semiconductor layer 13 or the substrate 10).

Figure 15C:
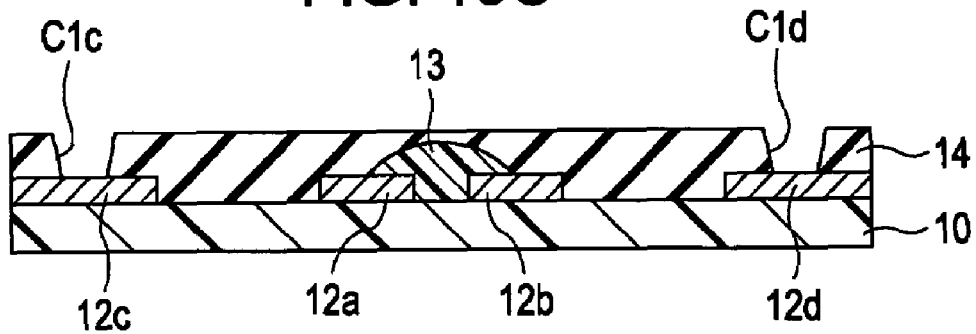

Next, as shown in FIG. 15C, contact holes C1c and C1d are formed on the corresponding conductive films 12c and 12d. The contact holes C1c and C1d are formed by using a hollow needle 100. The contact hole forming method will be described in greater detail with reference to FIG. 16. In the second to sixth embodiments, a needle 100 refers to a "hollow needle."

Figure 16A:
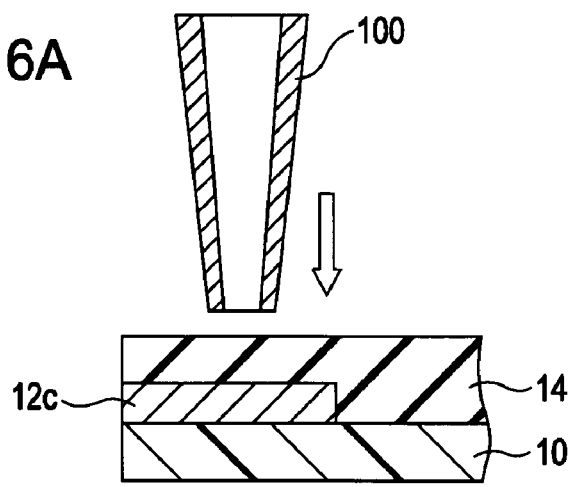
FIGS. 16A to 16C are process sectional views illustrating a semiconductor device manufacturing method (contact hole forming method) according to the second embodiment.

As shown in FIG. 16A, the hollow needle 100 is positioned on the conductive film 12c. The hollow needle 100 is a cylindrical member and has a hollow similar to a cylinder inside thereof. The hollow has diameter as small as the tip size of the hollow needle 100. The hollow needle 100 can be made of, for example, metal, such as iron Fe, stainless steel, and titanium, metal alloy, ceramic, or hard resin.

Preferably, the hollow needle 100 is a needle prepared by winding a metal thin film in a tapered form. According to this method, a very fine hollow needle can be manufactured. Accordingly, it is possible to form a very small contact hole. The structure of the very fine hollow needle will be described below.

By making the tip of the hollow needle 100 (in tapered form) very sharp, it is possible to smoothly insert the hollow needle 100 into the insulation film and to easily suck a film inside the hollow of the hollow needle 100.

Figure 16B:
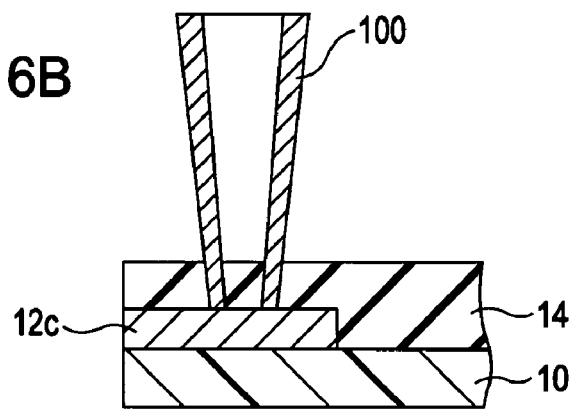

Next, as shown in FIG. 16B, the hollow needle 100 is moved downward so that the tip of the hollow needle 100 penetrates through the organic insulation film 14 and abuts against the conductive film 12c. At this time, the organic insulation film 14 intrudes into the hollow of the hollow needle 100.

Figure 16C:
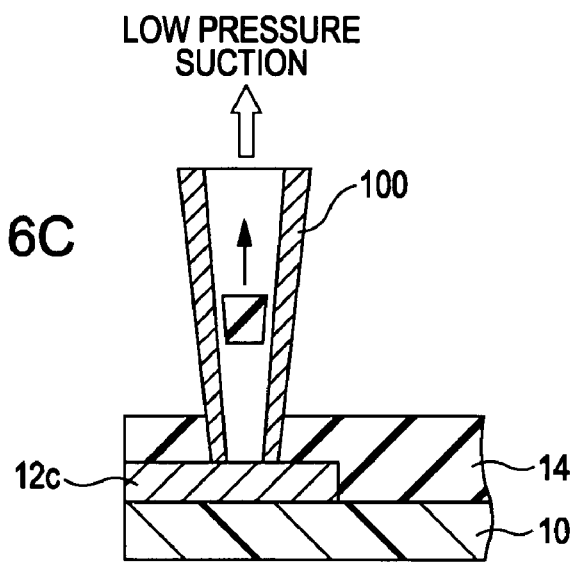

Next, as shown in FIG. 16C, by suctioning air in the hollow of the hollow needle 100 so as to lower a pressure in the hollow of the hollow needle 100, the organic insulation film 14 in the hollow is suctioned and removed so as for the organic insulation file 14 to be separated from the conductive film 12c. The suction is performed, for example, by a vacuum pump connected to the hollow needle 100. The organic insulation film 14 suctioned through the hollow needle 100 is recovered by a recovering portion disposed in the middle of a connection pipe connected between the hollow needle 100 and the vacuum pump.

Through the above processes, the contact hole (opening, aperture) C1c is formed on the conductive film 12c. Subsequently, the contact hole C1d (see FIG. 15C) is formed on the conductive film 12d using the hollow needle 100 through the same processes described above. Alternatively, a plurality of contact holes may be simultaneously formed using a plurality of hollow needles 100.

As described above, according to this embodiment, the insulation film on the conductive film is cut using the hollow needle 100 and then the cut portion of the insulation film is removed by suctioning. Accordingly, it is possible to reduce the amount of residue in the contact hole.

Further, since there is no need to form a photoresist film on the organic insulation film 14, it is possible to reduce the damage caused to the organic insulation film 14 due to photoresist residue generated due to adhesion between the photoresist film and the organic insulation film 14 and over-etching of the photoresist film. Still further, since it is possible to form the contact holes C1c and C1d without using a photolithography process, it is possible to prevent the organic semiconductor film 14 from deteriorating by exposure.

Figure 17:
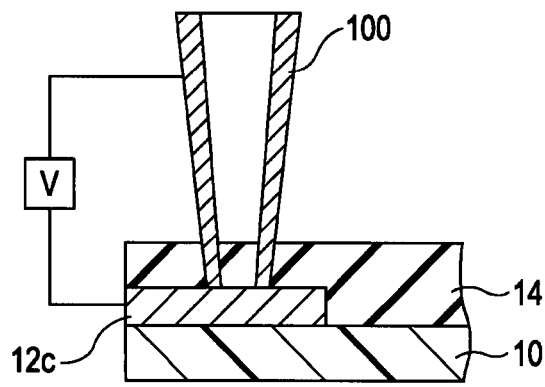
FIG. 17 is a process sectional view illustrating the semiconductor device manufacturing method (contact hole forming method) according to the second embodiment.
Figure 18:
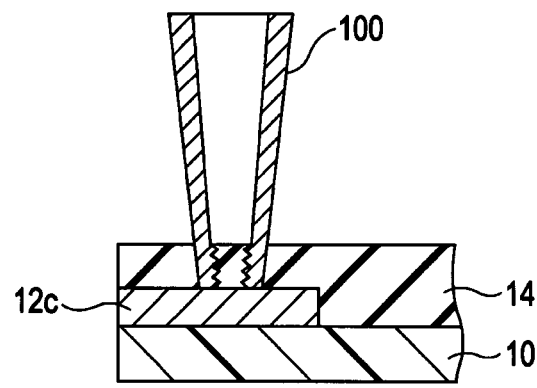
FIG. 18 is a process sectional view illustrating another semiconductor device manufacturing method (contact hole forming method) according to the second embodiment.
Figure 19:
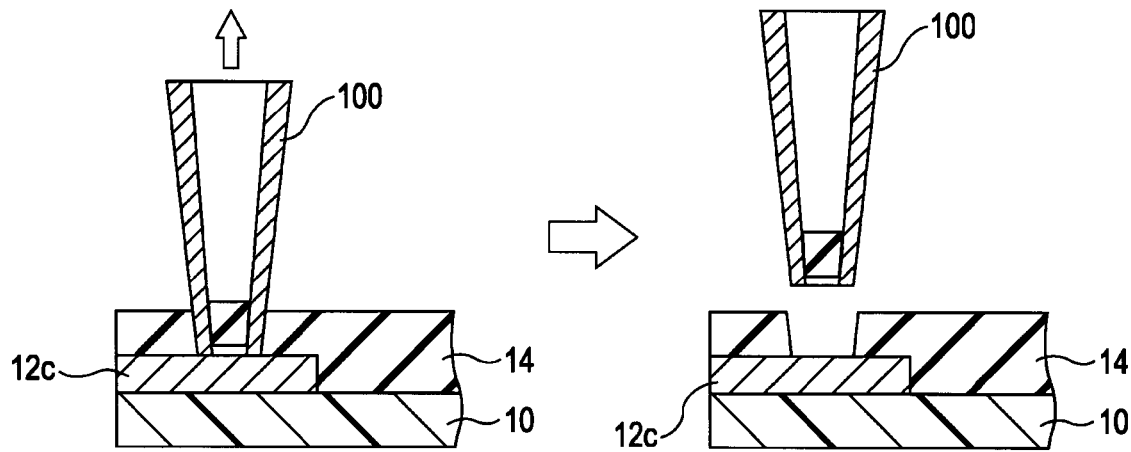
FIG. 19 is a process sectional view illustrating further semiconductor device manufacturing method (contact hole forming method) according to the second embodiment.

Next, a modification example of the above-described contact hole formatting method will be described with reference to FIGS. 17, 18, and 19. FIGS. 17, 18, and 19 are process sectional views illustrating another semiconductor device manufacturing method (contact hole forming method) according to this embodiment.

In FIG. 16B, the tip of the hollow needle 100 is in contact with the conductive film 12C. At this time, such contact state whether the hollow needle 100 is actually in contact with the conductive film 12c may be checked by testing electrical conduction state. As shown in FIG. 17, after the hollow needle 100 is moved downward so as to contact with the conductive film 12c, electrical conduction between the hollow needle 100 and the conductive film 12c is checked using a voltage meter V. When it is found that impedance between the hollow needle 100 and the conductive film 12c is high, it is determined that the hollow needle 100 is not in contact with the conductive film 12c. Accordingly, the hollow needle 100 must be more advanced downward. The electrical conduction state can be checked using an ampere meter, an oscilloscope, or combinations thereof instead of the voltage meter.

In FIGS. 16A to 16C, the hollow needle 100 has the planar inner surface. However, as shown in FIG. 18, the hollow needle may have the inner surface having protrusions (embossments, irregularities, corrugations) at a tip portion thereof (the tip portion having a length corresponding to a thickness of the insulation film on the conductive film). With this structure, the organic insulation film 14 in the hollow of the hollow needle is easily removed from the conductive film 12c.

In FIGS. 16A to 16C, the organic insulation film 14 in the hollow of the hollow needle is removed by suctioning. However, as shown in FIG. 19, the contact hole C1c may be formed by separating the organic insulation film 14 in the hollow from the conductive film 12 by suctioning and by raising the hollow needle 100 in a state that the organic insulation film 14 is held inside the hollow needle 100. Subsequently, for example, the inside of the hollow needle 100 is pressurized to remove the organic insulation film 14.

As described above, the contact hole forming method using the hollow needle can be modified in a variety of forms.

Figure 20A:
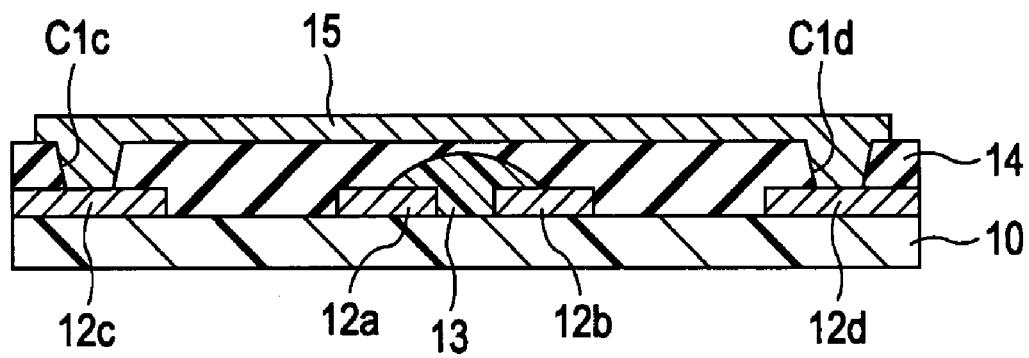
FIGS. 20A to 20B are process sectional views illustrating yet further semiconductor device manufacturing method (contact hole forming method) according to the second embodiment.
Figure 20B:
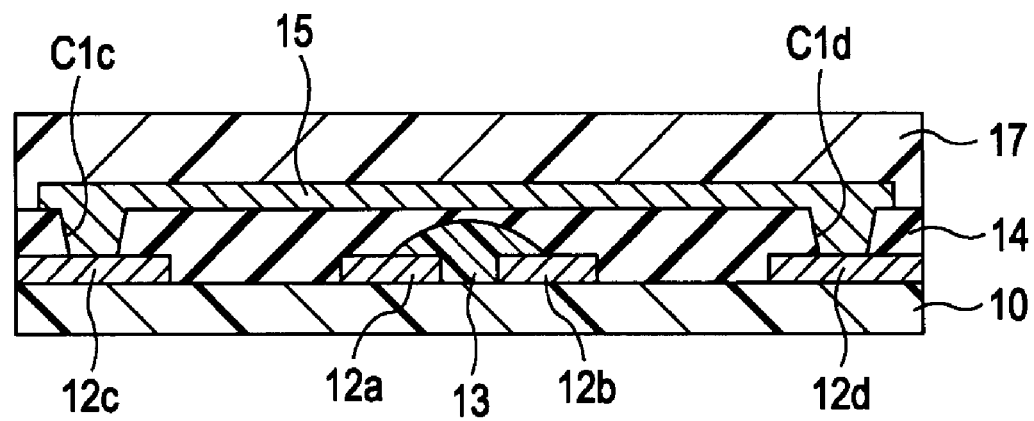

Processes performed after forming the contact holes C1c and C1d will be described with reference to FIGS. 20A and 20B. FIGS. 20A and 20B are process sectional views illustrating a semiconductor device manufacturing method (contact hole forming method) according to the embodiment. As shown in FIG. 20A, a gate electrode 15 (gate line, gate wiring) is formed on the organic insulation film 14 and in the contact holes C1c and C1d. The gate electrode 15 is formed, for example, by ejecting a conductive material solution by a liquid ejection method. That is, the gate electrode 15 is formed by ejecting the conductive material solution onto the organic insulation film 14 by moving a nozzle of a liquid ejection apparatus from a position above the contact hole C1c to a position above the contact hole C1d and solidifying the conductive material solution. The conductive material solution can be a metal particulate dispersion or PEDOT aqueous dispersion.

In the above-described embodiment, the residue of the insulation film in the contact hole is decreased. Accordingly, it is possible to achieve reliable interconnection between the conductive films 12c, 12d and the gate electrode 15.

Next, as shown in FIG. 20B, an insulation film serving as a protective film 17 is formed on the gate electrode 15. The insulation film is formed, for example, by coating an organic insulation material solution by a spin coating method. The organic insulation material can be polyvinyl phenol, phenol resin (also called novolac resin), poly methyl methaacrylate, or the like as described above.

Through the above-described processes, a semiconductor device is manufactured. Other wiring layers may be optionally and adequately formed on the substrate 10. Some of the conductive films 12a, 12b, 12c, and 12d may not be formed in the same layer but formed other layers. That is, structure of the semiconductor may be modified according to circumstances.

Third Embodiment

In this embodiment, a insulation film is decomposed by irradiating light on the insulation film in a hollow of a hollow needle in the state in which the hollow needle is in contact with a conductive film. Hereinafter, this embodiment will be described in greater detail with reference to the accompanying drawings. In this embodiment, processes except for a contact hole forming process are the same as those in the second embodiment. Accordingly repetitive explanation about the same processes is omitted.

Figure 21A:
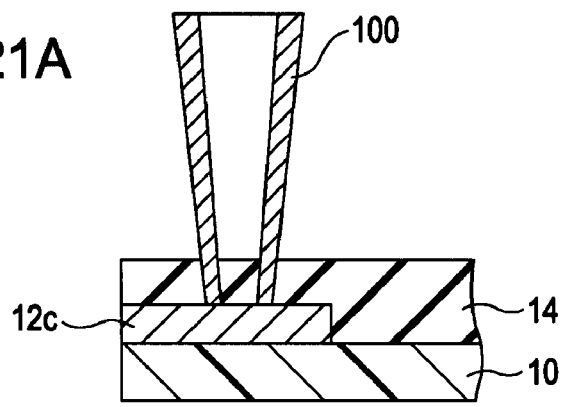
FIGS. 21A to 21C are process sectional views illustrating a semiconductor device manufacturing method (contact hole forming method) according to a third embodiment.
Figure 21B:
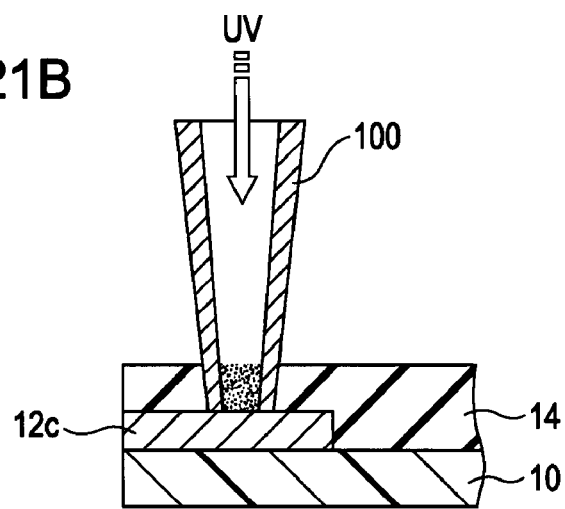
Figure 21C:
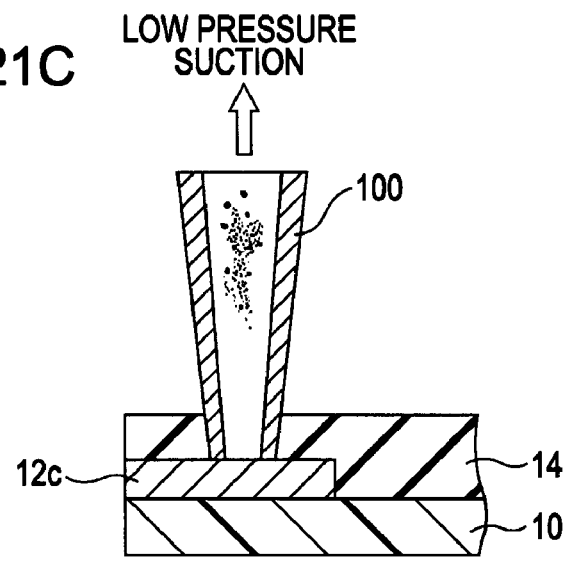

FIGS. 21A to 21C are process sectional views illustrating a semiconductor device manufacturing method (contact hole forming method) according to this embodiment. As in the second embodiment, a conductive film 12c and an organic insulation film 14 are sequentially formed on a substrate 10, a hollow needle 100 is positioned on the organic insulation film 14 formed on the conductive film 12c, and the hollow needle 100 is advanced downward so as to be brought into contact with the conductive film 12c (see FIG. 21A).

Next, as shown in FIG. 21B, ultraviolet rays are irradiated onto the organic insulation film 14 through the hollow of the hollow needle 100. Thanks to the UV rays, the organic insulation film 14 in the hollow needle 100 is decomposed, and thus is vaporized or turned into power. At this time, in order to prevent the organic insulation film 14 disposed around the circumferential edge of the hollow needle 100 from being decomposed, the hollow needle 100 is made of a material which does not transmit light (UV). That is, UV rays are irradiated only through the hollow of the hollow needle 100.

Next, decomposed organic insulation film is removed by suctioning as in the second embodiment. Next, as in the second embodiment, a gate electrode 15 is formed on the organic insulation film 14 and in the contact holes C1*c* and C1*d*. Finally, a protective layer 17 is formed on the gate electrode 15 (see FIG. 20B).

According to this embodiment, the organic insulation film 14 disposed in the hollow of the hollow needle 100 is irradiated with UV rays and thus residue of the organic insulation film 14 is reduced. Accordingly, it is possible to achieve reliable interconnection between the conductive film 12*c* and the gate electrode 15.

In this embodiment, UV rays are exemplified but other kinds of light (including laser) can be used to decompose the organic insulation film. Further, the organic insulation film 14 may be altered by optical irradiation so that it becomes the state in which it can be easily stripped off or suctioned.

For example, oxygen in the hollow of the hollow needle is turned into ozone by UV radiation, and the organic insulation film 14 may be decomposed by the ozone. Further, the organic insulation film 14 may be cured (contracted) by UV radiation, so that it can be easily suctioned.

The modification examples (FIGS. 17 to 19) of the second embodiment may be applied to this embodiment.

Fourth Embodiment

In this embodiment, a liquid (insulation film dissolving liquid) which can dissolve an insulation film is introduced into a hollow of a hollow needle in the state in which the hollow needle is into contact with a conductive film in order to dissolve the insulation film. Hereinafter, this embodiment will be described in greater detail with reference to the accompanying drawings. In this embodiment, other processes except for a contact hole forming process are the same as in the second embodiment. Accordingly, repetitive explanation on the same processes is omitted.

Figure 22A:
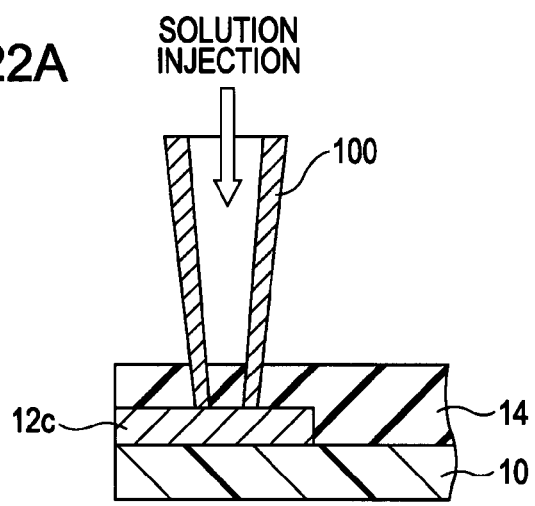
FIGS. 22A to 22C are process sectional views illustrating a semiconductor device manufacturing method (contact hole forming method) according to a fourth embodiment.
Figure 22B:
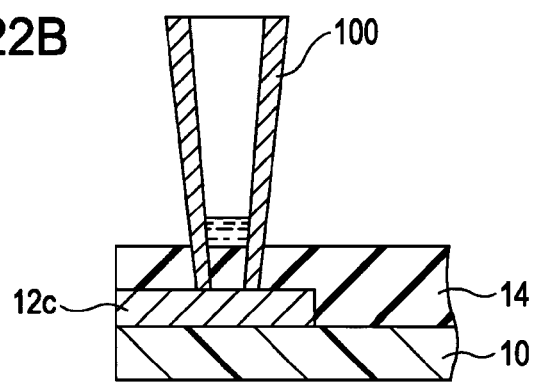
Figure 22C:
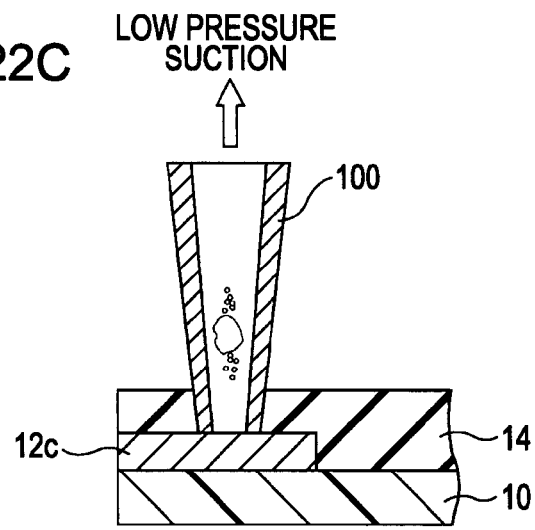

FIGS. 22A to 22C are process sectional views illustrating a semiconductor device manufacturing method according to this embodiment. As in the second embodiment, a conductive film 12*c* and an organic insulation film 14 are sequentially formed on a substrate 10, a hollow needle 100 is positioned on the organic insulation film 14 formed on the conductive film 12*c*, and the hollow needle 100 is advanced downward so as to be brought into contact with the conductive film 12*c*. Next, a liquid (dissolving liquid) which can dissolve the organic insulation film 14 is injected into a hollow of the hollow needle 100 (see FIGS. 22A and 22B). The dissolving liquid can be chloroform, toluene, xylene, or the like.

In this embodiment, the organic insulation film 14 in the hollow of the hollow needle 100 is dissolved by make the insulation film 14 in the hollow needle 100 contact the dissolving liquid, and then the produced solution is removed by suctioning as in the second embodiment (see FIG. 22C). Next, as in the second embodiment, a gate electrode 15 is formed on the organic insulation film 14 and in the contact holes C1*c* and C1*d*, and a protective film 17 is formed on the gate electrode 15 (see FIG. 20B).

According to this embodiment, since the dissolving liquid which can dissolve the organic insulation film 14 is injected into the hollow of the hollow needle 100, it is possible to reduce the amount of residue in the contact hole. Accordingly, it is possible to achieve reliable interconnection between the conductive film 12*c* and the gate electrode 15.

In this embodiment, the organic insulation film 14 in the hollow needle 100 may be completely dissolved. Alternatively, the organic insulation film 14 in the hollow of the hollow needle 100 may be incompletely dissolved. That is, only a contact portion between the inner surface of the hollow needle 100 and the insulation film 14 or a contact portion between the conductive film 12*c* and the organic insulation film 14 may be dissolved. A solution or a liquid which can alter the organic insulation film 14 into the state of being easily peeled or sucked can be used instated of the dissolving liquid. For this instance, it is preferable that the hollow needle 100 has high resistance to such solution. In order to remove the dissolved material or residue remaining in the hollow needle 100, the inside of the hollow needle 100 may be rinsed using the dissolving liquid which can dissolve the organic insulation film 14.

The modification examples (see FIGS. 17, 18, and 19) of the second embodiment may be applied to this embodiment.

Fifth Embodiment

In this embodiment, in the state in which a hollow needle contacts a conductive film, the hollow needle is heated so as to melt (dissolve) an insulation film in a hollow of the hollow needle. Hereinafter, this embodiment will be described with reference to the accompanying drawings. In this embodiment, other processes except for a contact hole (C1*c*) forming process are the same as in the second embodiment, and thus repetitive explanation on the same processes is omitted.

Figure 23A:
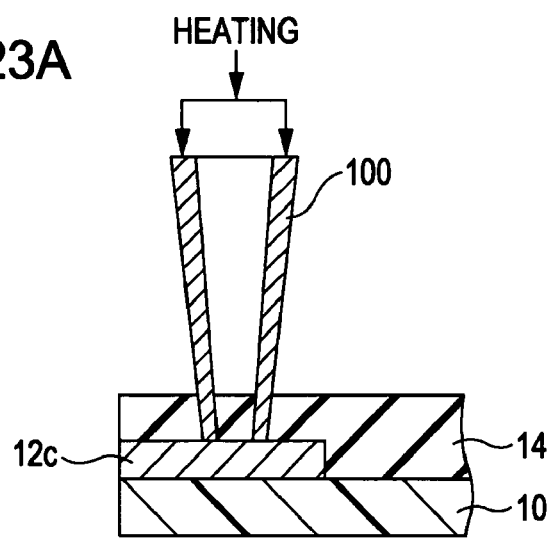
FIGS. 23A to 23C are process sectional views illustrating a semiconductor device manufacturing method (contact hole forming method) according to a fifth embodiment.
Figure 23B:
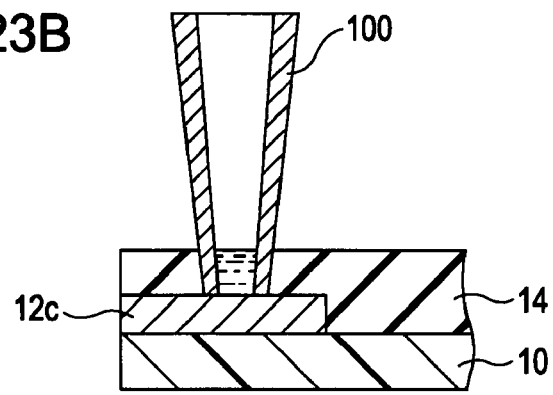
Figure 23C:
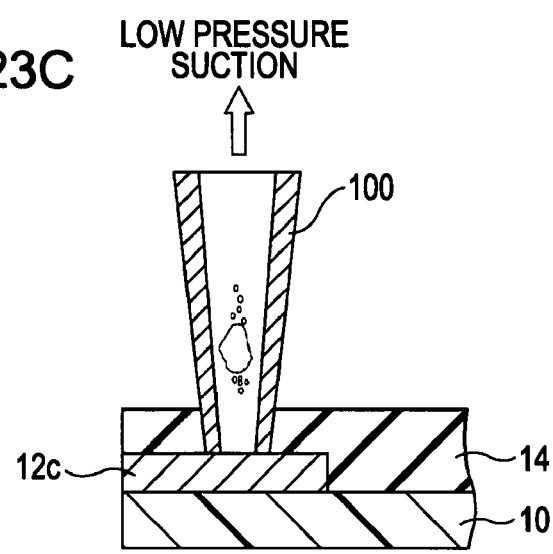

FIGS. 23A to 23C are process sectional views illustrating a semiconductor device manufacturing method (contact hole forming method) according to this embodiment. As in the second embodiment, a conductive film 12*c* and an organic insulation film 14 are sequentially formed on a substrate 10, a hollow needle 100 is positioned on the surface of the organic insulation film 14 formed on the conductive film 12, and the hollow needle 100 is advanced downward so as to be brought into contact with the surface of the conductive film 12*c*. Next, the hollow needle 100 is heated in order to melt (or dissolve) the organic insulation film 14 in the hollow needle 100 (see FIGS. 23A and 23B). Next, as in the second embodiment, a gate electrode 15 is formed on the organic insulation film 14 and in contact holes C1*c* and C1*d*, and a protective film 17 is formed on the gate electrode 15 (see FIG. 20B).

According to this embodiment, since the organic insulation film 14 is heated by heating the hollow needle 100, it is possible to reduce the amount of residue in the contact holes. Accordingly, it is possible to reliable interconnection between the conductive film 12*c* and the gate electrode 15.

In this embodiment, the organic insulation film 14 in the hollow needle 100 may be completely melted. Alternatively, the organic insulation film 14 in the hollow needle 10 may be incompletely melted. That is, only part of the organic insulation film 14 at a contact position where the hollow needle 100 contacts the organic insulation film 14 may be melted. Alternatively, the organic insulation film 14 may be altered so that it becomes the state of being easily stripped off or suctioned. Here, it is preferable that the hollow needle 100 is made of a material having good thermal conductivity. In particular, the inner surface of the hollow needle has relatively high thermal conductivity in comparison with the outer surface. For example, it is preferable that a metal hollow needle 100 is coated with an insulation material so that heat is transferred along the inner surface of the hollow needle rather than the outer surface.

Here, the organic insulation film 14 is indirectly heated by heating the hollow needle 100, but the organic insulation film 14 may be directly heated by UV radiation as in the third embodiment. Modification examples (see FIGS. 17, 18, and 19) of the second embodiment may be applied to this embodiment.

Sixth Embodiment

In this embodiment, a method of checking electrical conduction in a contact hole is described.

Figure 24:
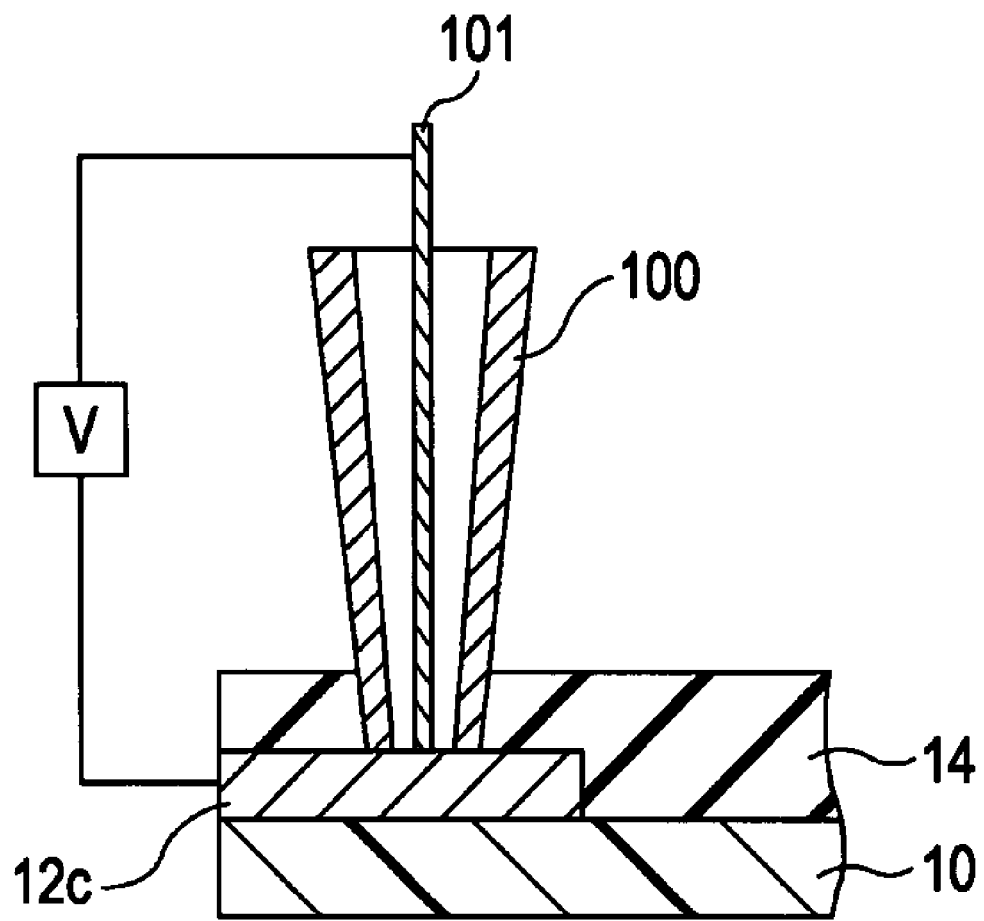
FIG. 24 is a process sectional view illustrating a semiconductor device manufacturing method (contact hole forming method) according to a sixth embodiment.

FIG. 24 shows a process sectional view illustrating a semiconductor device manufacturing method (contact hole forming method) according to this embodiment.

That is, after forming a contact hole, a hollow needle 100 is moved downward inside the contact hole. After that, an electric bar 101 is moved downward to the surface of a contact film 12c.

In this state, impedance between the electric bar 101 and the conductive film 12c is measured by a voltage meter V. At this time, high impedance means that the residue of an organic insulation film 14 remains on the bottom of the contact hole. Accordingly, residue suction is performed again using the hollow needle 100 described in relation with the second, third, fourth, and fifth embodiments in order to achieve reliable interconnection.

Alternatively, the electrical conduction state in the contact hole may be checked using an ampere meter, oscilloscope, or a combination thereof. Here, in the case in which the hollow needle 100 has an electrical conductive property, the inner surface of the hollow needle 100 is coated with an insulation material in order to prevent electrical short between the electrical bar 101 and the hollow needle 100. Alternatively, it is preferable that almost all the electric bar 101 which is likely to contact the inner surface of the hollow needle 100 is coated with an insulation material except for a tip thereof.

According to this embodiment, since it is possible to check electrical conduction state (residue remaining or no residue), it is possible to achieve reliable interconnection between a conductive film 12c and a gate electrode 15.

Seventh Embodiment

FIGS. 25A, 25B, 25C, 27A, 27B, 28C, and 29 are process sectional views illustrating a semiconductor device manufacturing method (contact hole forming method) according to this embodiment. FIGS. 26A and 26B are sectional views illustrating a structure of a double hollow needle.

Figure 25A:
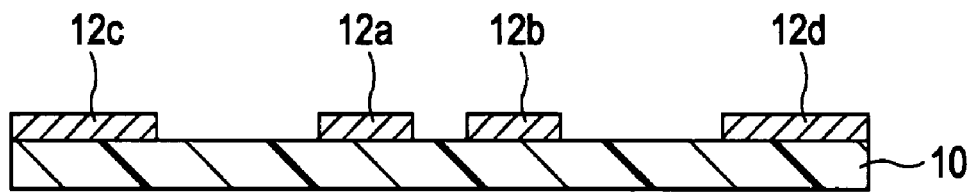
FIGS. 25A to 25C are process sectional views illustrating a semiconductor device manufacturing method (contact hole forming method) according to a seventh embodiment.
Figure 26A:
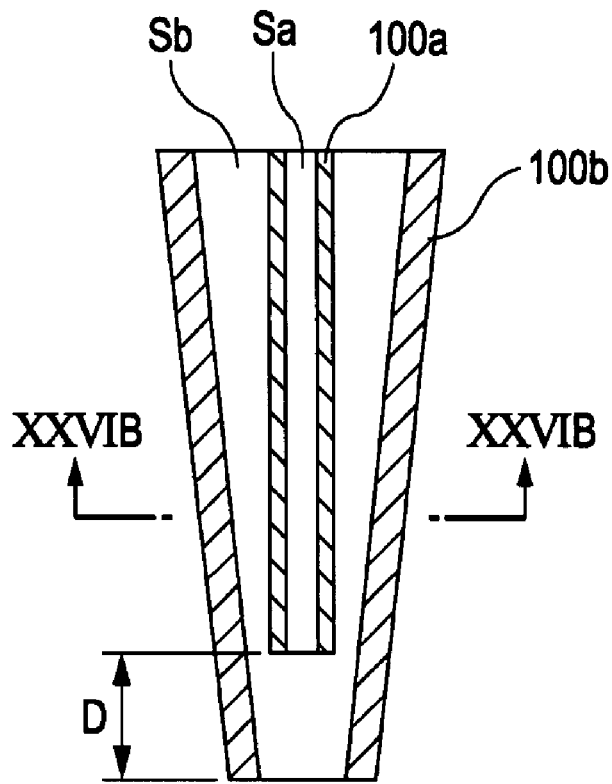
FIGS. 26A and 26B are sectional views illustrating a double-hollow needle.
Figure 26B:
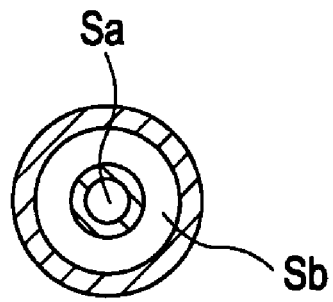

As shown in FIG. 25A, a plastic substrate is prepared as an insulation substrate 10, and conductive films 12a through 12d are formed on the insulation substrate 10. The conductive films 21a to 12d are formed by the method according to the second embodiment.

Figure 25B:
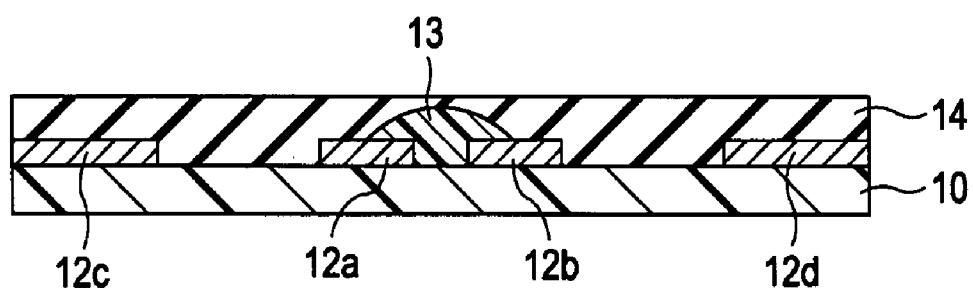

Next, as shown in FIG. 25B, an organic semiconductor film 13 is formed between the conductive films 12a and 12b. The organic semiconductor film 13 is formed, for example, by the method according to the second embodiment.

Figure 25C:
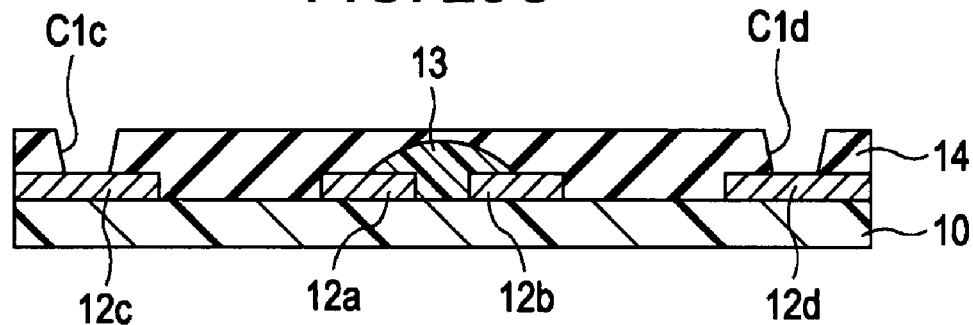

As shown in FIG. 25C, contact holes C1c and C1d are formed on the conductive films 12c and 12d, respectively. The contact holes C1c and C1d are formed by using a double hollow needle 100, and a contact hole forming method using the double hollow needle 100 will be described with reference to FIGS. 26A, 26B and 27A to 27C. In addition, the needle 100 according to the seventh to eleventh embodiments refers "double hollow needle."

FIGS. 26A and 26B show a structure of the double hollow needle 100. As shown in FIGS. 26A and 26B, a first hollow needle (inner needle) 100a is disposed at the center of a second hollow needle (outer needle) 100b. The first hollow needle 100a has a hollow Sa at the center thereof, and the second needle 100b has a hollow Sb which does not include the hollow Sa. The hollow Sb is a hollow disposed outside the hollow Sa.

The tip of the first hollow needle 100a is distanced from the tip of the second hollow needle 100b inside the hollow Sb by a distance D. The first hollow needle 100a and the second hollow needle 100b are made of, for example, iron Fe. The second needle 100b is as thin as a tip, so that the second needle 100b can be easily inserted into a film. This hollow needle can be formed by winding a metal thin film in a taper form. According to such method, it is possible to manufacture a very thin hollow needle, and thus it is possible to form a very small contact hole. The structure of such very thin hollow needle will be described below.

By use of such double hollow needle 100, a dissolving liquid (etchant liquid) or a decomposing gas (etchant gas) which can dissolve or decompose an organic insulation film 14 in the first hollow needle 100a (hollow Sa) can be introduced (injected) into the hollow Sa, and reaction products can be suctioned through the hollow Sb. Accordingly, it is possible to form the contact holes C1c and C1d with high precision. A contact hole forming method using the double hollow needle will be described below.

Figure 27A:
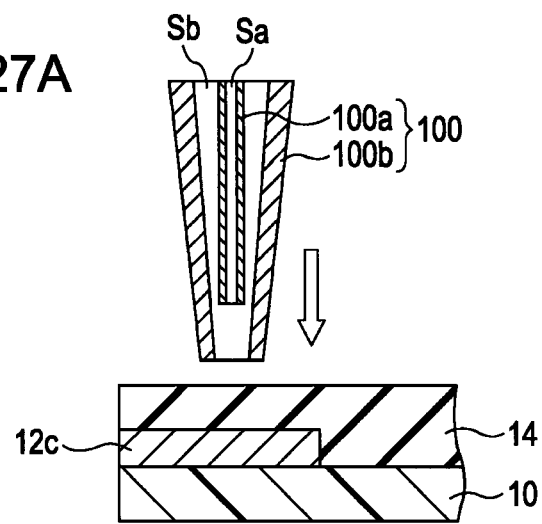
FIGS. 27A to 27C are process sectional views illustrating the semiconductor device manufacturing method according to the seventh embodiment.

First, as shown in FIG. 27A, the double hollow needle 100 is positioned on the organic insulation film 14 formed on a conductive film 12c. The double hollow needle 100 is moved downward through the organic insulation film 14 so that the second hollow needle (outer needle) 100b is brought into contact with the surface of the conductive film 12c (see FIG. 27B). At this time, the organic insulation film 14 intrudes into the hollow Sa and Sb of the second hollow needle (outer needle) 100b.

Figure 32A:
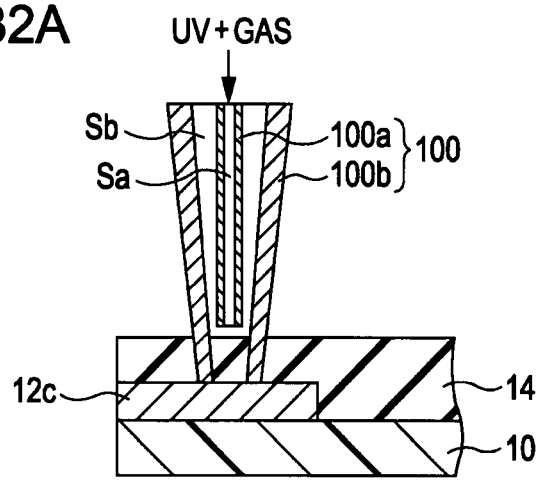
FIGS. 32A to 32C are process sectional views illustrating a semiconductor device manufacturing method according to a ninth embodiment.
Figure 32B:
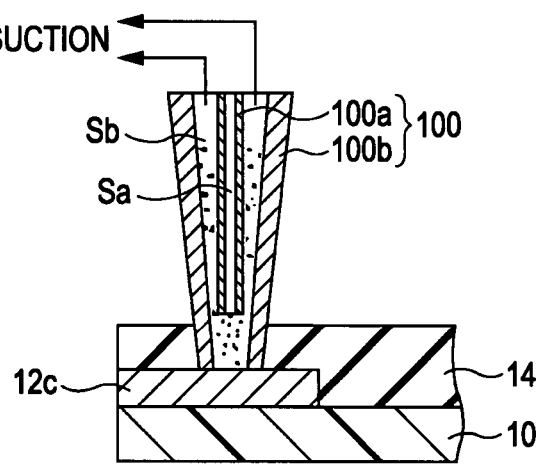

Next, as shown in FIG. 32B, a dissolving liquid (etchant liquid) which can dissolve the organic insulation film 14 is introduced into the hollow Sa of the first hollow needle (inner needle) 100a. The dissolving liquid can be chloroform, toluene, and xylene.

At this time, as the dissolving liquid which can dissolve the organic insulation film 14 contacts the organic insulation film 14 in the double hollow needle 100, the organic insulation film 14 is dissolved. As shown in FIG. 27C, the dissolved solution is suctioned and removed through the hollow Sb. As a result, it is possible to reduce the amount of residue in the contact hole and thus it is possible to achieve reliable interconnection through the contact holes C1c and C1b.

In addition, the distance D is set to be larger than thickness of the organic insulation film 14. Accordingly, the dissolving liquid can easily permeate into the organic insulation film 14. As a result, it is possible to effectively form the contact holes. The first hollow needle (inner needle) 100a can be arranged so as to move up and down so that the position of the tip of the first hollow needle 100a can be adjusted according to the thickness of the organic insulation film 14.

The suction is, for example, is performed using a pump communicating with the hollow Sb. In addition, the suctioned dissolved solution of the organic insulation film 14 is recovered by a recovery portion installed in the middle of a connection pipe connected between the hollow Sb and the vacuum pump.

In this embodiment, the organic insulation film 14 in the hollow may be completely dissolved. Alternatively, amount of the organic insulation film 14 may remain in the solid state by the amount as much as that can be suctioned. Here, the first hollow needle (inner needle) 100a may be made of a material having high chemical resistance with respect to the dissolving liquid.

Through the above-described processes, a contact hole (opening, aperture) C1c is formed on the conductive film 12c. Next, a contact hole C1d is formed on the conductive film 12d by the above-described method using the same double hollow needle 100. Alternatively, a plurality of contact holes can be simultaneously formed using a plurality of double hollow needles 100.

As described above, according to this embodiment, the dissolving liquid that can dissolve the organic insulation film 14 is injected into the hollow of the first needle (inner needle) 100a using the double hollow needle 100 and the dissolve organic insulation film 14 is suctioned through the hollow Sb of the second hollow needle (outer needle) 100b. Accordingly, it is possible to reduce the amount of residue in the contact hole.

In particular, since it is possible to continuously suction the reaction product (dissolved solution) at any time, non-reacted portion of the organic insulation film is always exposed to the dissolving liquid. Accordingly, since the dissolving liquid supplied to the exposed portion, the organic insulation film 14 can be effectively removed.

Further, since the contact hole forming method according to this embodiment does not need to a photoresist film, it is possible to reduce damage caused to the organic insulation film 14 attributable to resist residue generated due to adhesion between a photoresist film and an organic insulation film 14 or over-etching of the photoresist film. Still further, since it is possible to form the contact holes C1c and C1d without using a photolithography process, it is possible to prevent an organic semiconductor film 14 from deteriorating by light exposure.

Figure 28:
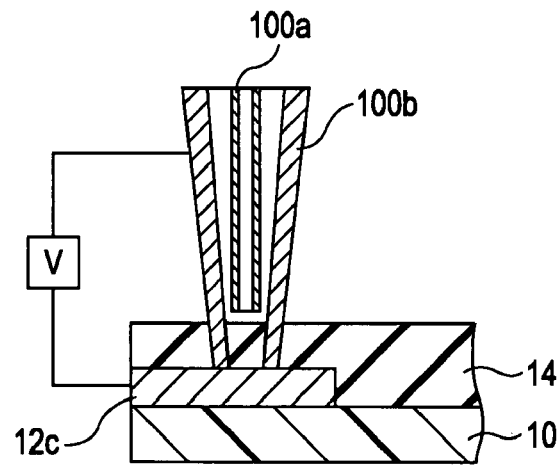
FIG. 28 is a process sectional view illustrating another semiconductor device manufacturing method according to the seventh embodiment.

Next, modification examples of this invention will be described with reference to FIG. 28. FIG. 28 shows a process sectional view illustrating another semiconductor device manufacturing method (contact film forming method) according to this embodiment.

Figure 27B:
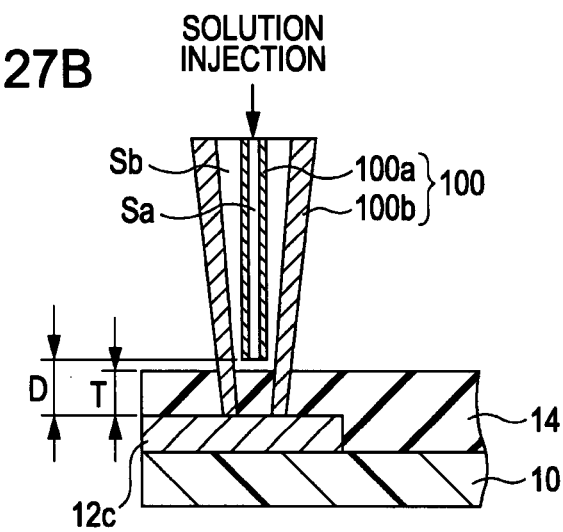
Figure 27C:
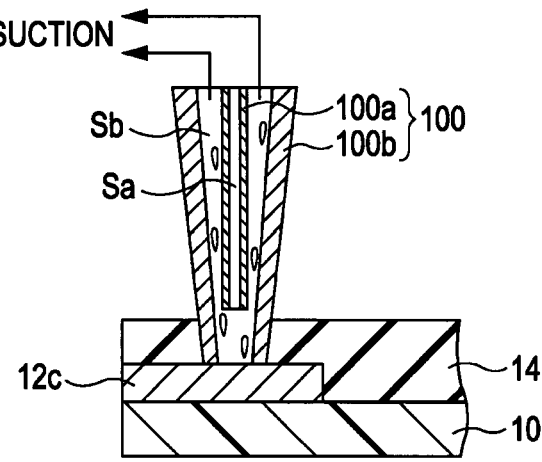

In FIG. 27B, the second hollow needle (outer needle) 100b of the double hollow needle 100 is in direct contact with the surface of the conductive film 12c, but it may be preferable that the contact state between the second hollow needle (outer needle) 100b and the conductive film 12c is checked using a method of checking electrical conduction state. That is, as shown in FIG. 28, the second hollow needle (outer needle) 100b is moved downward so as to be brought into contact with the surface of the conductive film 12c, the electrical conduction state between the second hollow needle (outer needle) 100b and the conductive film 12c is checked using a voltage meter V. In the case in which impedance between the second hollow needle (outer needle) 100b and the conductive film 12c is high, the second hollow needle (outer needle) 100b must be moved downward so as not to be brought into contact with the conductive film 12c. In addition, the electrical conduction state may be checked using an ampere meter, an oscilloscope, or a combination thereof instead of the voltage meter V.

In the case in which the first hollow needle (inner needle) 100a is made of a conductive material, in order to prevent the first hollow needle (inner needle) 100a and the second hollow needle (outer needle) 100b from being electrically short-circuited, the inner surface of the second hollow needle (outer needle) 100b or the outer surface of the first hollow needle (inner needle) 100a may be coated with an insulation material. In the case in which the first hollow needle 100a and the second hollow needle 100b are spaced apart from each other by a distance which is maintained constant, and they are not likely to be short circuited, the surfaces of the first hollow needle 100a and the second hollow needle 100b may not be coated.

Figure 29A:
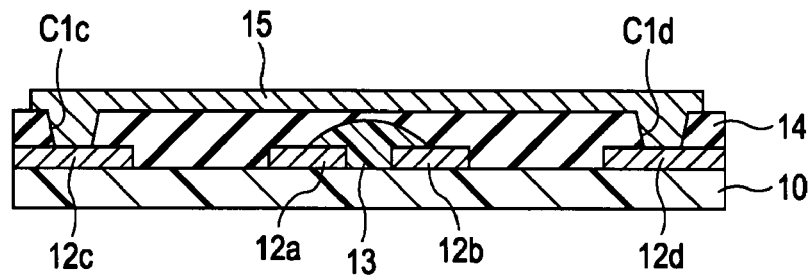
FIGS. 29A to 29B are process sectional views illustrating further semiconductor device manufacturing method (contact hole forming method) according to the seventh embodiment.
Figure 29B:
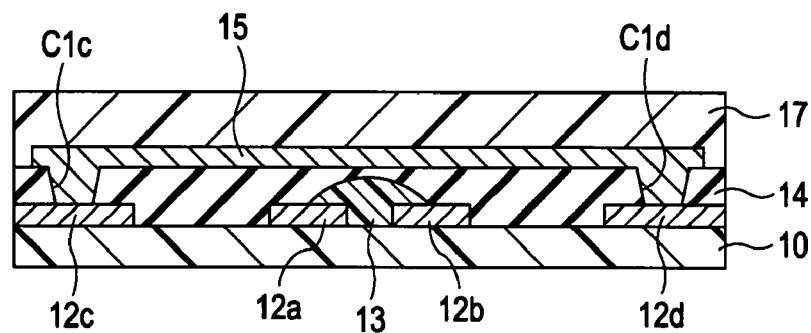

Next, subsequent processes after the processes of forming the contact holes C1c and C1b will be described with reference to FIGS. 29A and 29B. FIGS. 29A and 29B are process sectional views illustrating a semiconductor device manufacturing method (contact hole forming method) according to this embodiment.

As shown in FIG. 29A, on an organic insulation film 14 including the organic insulation film 14 in the contact holes C1c and C1d is formed a gate electrode 15 (gate line, gate wiring). The gate electrode 15 is, for example, formed by the method described in relation with the second embodiment.

As described above, according to this embodiment, it is possible to reduce the amount of residue remaining in the contact holes. Accordingly, it is possible to achieve reliable interconnection between the conductive films 12c and 12d and the gate electrode 15.

As shown in FIG. 29B, an insulation film serving as a protective film 17 is formed on the gate electrode 15. This insulation film is formed by the method according to the second embodiment.

Through the above-mentioned processes, a semiconductor device is completed. In addition, other wiring layers may be formed on the substrate 10. Further, the structure of the semiconductor device may be modified in an adequate manner such that the conductive films 12a, 12b, 12c and 12d may not be provided in the same layer or may be provided in different layers according to circumstances.

Eighth Embodiment

In the seventh embodiment, the first hollow needle (inner needle) 100a contains a liquid which can dissolve the organic insulation film 14 inside thereof but may held a gas which can decompose the organic insulation film 14. Hereinafter, the eighth embodiment will be described with reference to the accompanying drawings. In this embodiment, processes except for a contact hole (C1c) forming process are the same as in the seventh embodiment, repetitive explanation will be omitted.

Figure 30A:
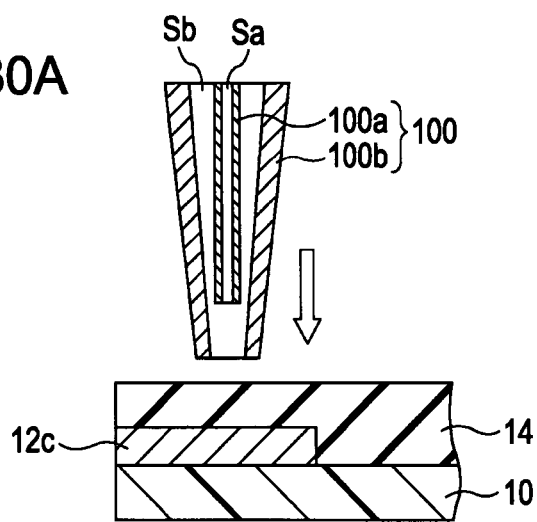
FIGS. 30A to 30C are process sectional views illustrating a semiconductor device manufacturing method (contact hole forming method) according to an eighth embodiment.
Figure 30B:
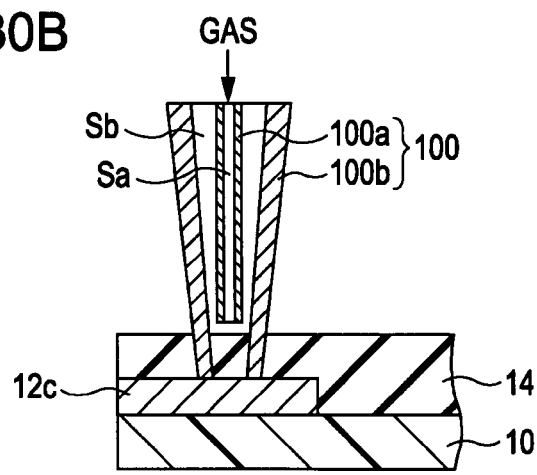
Figure 30C:
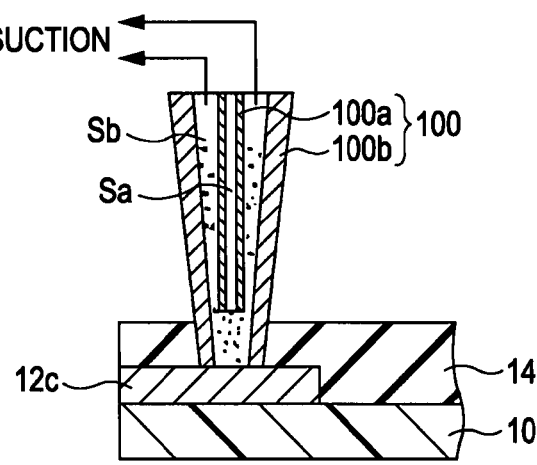

FIGS. 30A to 30B are process sectional views illustrating a semiconductor device manufacturing method (contact hole forming method), according to this embodiment. As in the seventh embodiment, a conductive film 12c and an organic insulation film 14 are sequentially formed on a substrate 10, a double-hollow needle 100 is brought into contact with the surface of the conductive film 12C (see FIG. 30A), and the double-hollow needle 100 is moved downward until a second hollow needle (outer needle) 100b of the double-hollow needle 100 comes into contact with the conductive film 12c.

As shown in FIG. 30B, a decomposition gas (etching gas) which can decompose the organic insulation film 14 is introduced into the second hollow needle (outer needle) 100b. The organic insulation film 14 in the double-hollow needle 100 is decomposed by the decomposing gas and thus it is vaporized or is turned into powder. In the case of a film made of organic molecules, almost of the film is decomposed by an etching gas and thus is vaporized. The decomposition gas can be an oxidizing gas, such as ozone $O_3$. The decomposed organic insulation film is removed through a hollow Sb by suctioning as in the sixth embodiment. Next, as in the seventh embodiment, a gate electrode 15 is formed on the organic insulation film 14 and in the contact holes C1c and C1d. Finally, a protective film 17 is formed on the gate electrode 15 (see FIG. 29B).

According to this embodiment, the double-hollow needle 100 is used, the decomposition gas which can decompose the organic insulation film 14 is introduced into the first hollow needle (inner needle) 100a, and the decomposed organic insulation film 14 is sucked through the hollow Sb of the second hollow needle (outer needle) 100b. Accordingly, it is possible to more efficiently reduce the amount of residue in the contact hole.

Further, since it is possible to remove the reaction product (decomposed material) at any time, no-reacted portion can be always exposed to the decomposition gas. Further, since the decomposition gas is supplied to the exposed no-reacted portion, it is possible to effectively remove the organic insulation film 14. Accordingly, it is possible to achieve reliable interconnection between the conductive film 12c and the gate electrode 15.

Further, the modification example (see FIG. 28) of the seventh embodiment may be applied to this embodiment.

Figure 31:
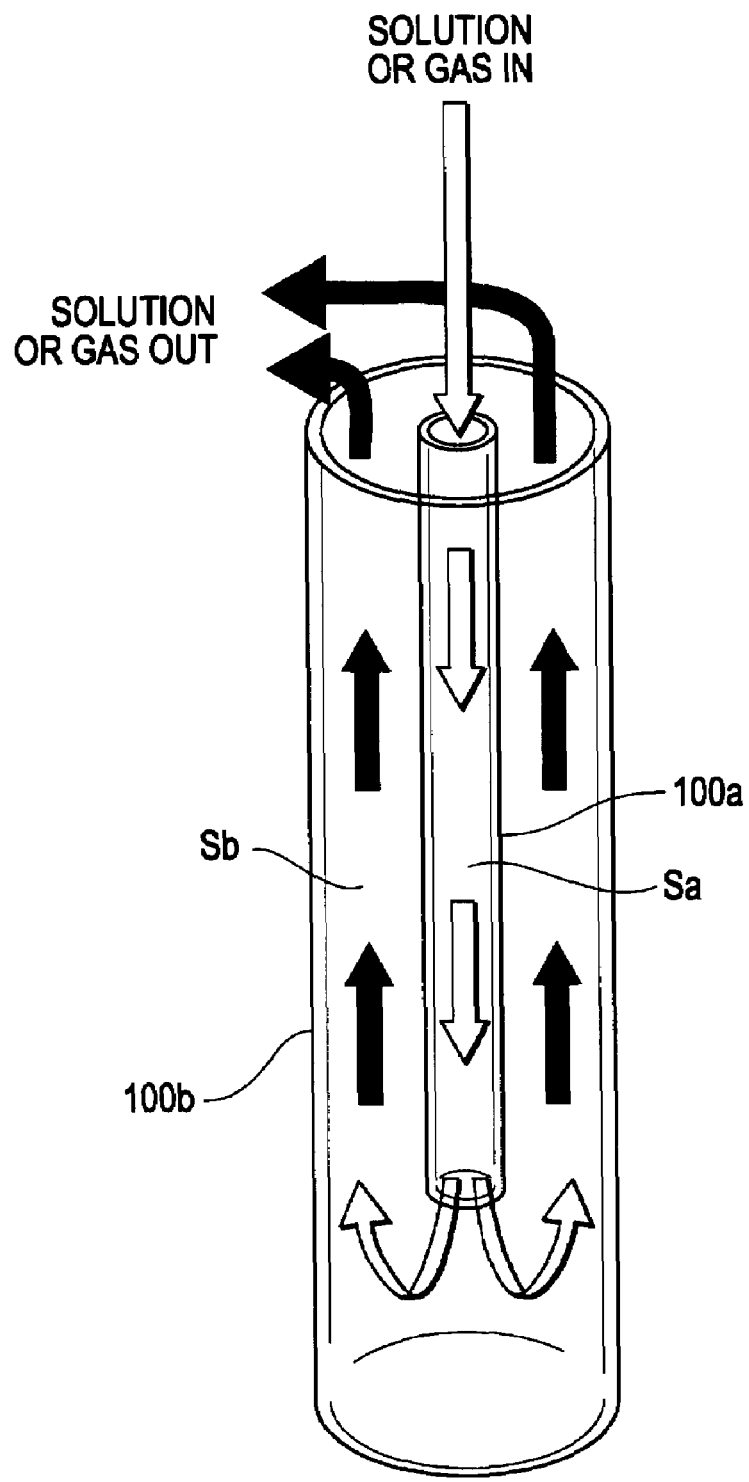
FIG. 31 is a schematic view illustrating the flow of a dissolving liquid (or decomposing gas) and a reaction product (dissolved solution, decomposed material) according to the seventh and eighth embodiments in the double-hollow needle.

FIG. 31 schematically shows flow of the decomposition liquid (or gas) and the reaction product (dissolved solution, decomposition product) according to the seventh and eight embodiments in the double-hollow needle 100.

Ninth Embodiment

According to ninth embodiment, decomposition gas which can decompose an organic insulation film 14 is injected into a first hollow needle (inner needle) 100a and ultraviolet rays (UV) are irradiated onto the organic insulation film 14 in the first hollow needle (inner needle) 100a. This embodiment will be described in greater detail with reference to the accompanying drawings. In this embodiment, processes except for a contact hole (C1c) forming process are the same as in the seventh embodiment. Accordingly, repetitive explanation is omitted.

Figure 32C:
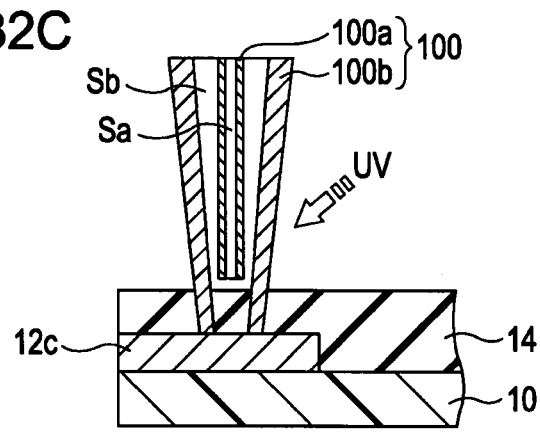

FIGS. 32A to 32C are process sectional views illustrating a semiconductor device manufacturing method (contact hole forming method) according to this embodiment. As in the seventh embodiment and the ninth embodiment, a conductive film 12c and an organic insulation film 14 are sequentially formed on a substrate 10, a double hollow needle 100 is placed on the organic insulation film 14 formed on the conductive film 12c, and the second hollow needle 100 is moved downward so that a second hollow needle (outer needle) 100b of the double hollow needle 100 is brought into contact with the surface of the conductive film 12c.

As shown in FIG. 32A, a reaction gas (etchant gas), for example oxygen $O_2$ is introduced into the second hollow needle (outer needle) 100b. Further, UV rays are irradiated onto the organic insulation film 14 through hollows Sa and Sb of the double hollow needle 100. Thanks to the UV irradiation, oxygen is turned into ozone. The organic insulation film 14 is decomposed by the ozone. The decomposed organic insulation film is removed through the hollow Sb by suctioning as in the seventh embodiment (see FIG. 32B). Next, as in the seventh embodiment, on the organic insulation film 14 including the organic insulation film 14 in the contact holes C1c and C1d, a gate electrode 15 is formed. Next, a protection film 17 is formed on the gate electrode 15 (see FIG. 29B).

As described above, according to this embodiment, UV rays are irradiated to the organic insulation film 14 while a reacting gas is introduced so as to generate ozone, so that the organic insulation film 14 can be decomposed. Accordingly, as in the eighth embodiment, it is possible to reduce the amount of residue in the contact holes, and thus it is possible to achieve reliable interconnection between the conductive film 12c and the gate electrode 15.

There are two UV irradiation methods. One is to irradiate UV rays through the hollow Sa or Sb of the double hollow needle 100, and the other one is to irradiate UV rays from the outside of the second hollow needle 100b. In the later case, the second hollow needle 100b is made of a light-transmissible material, for example quartz or a transparent conductive film (see FIG. 32C). Here, the double hollow needle 100 can be made of a material having high resistance to ozone. That is, the double hollow needle 100 can be made of a material which is hardly oxidizable by ozone, for example, a precious metal, such as platinum Pt. Further, the double hollow needle 100 may be made of an inorganic material because the inorganic material is oxidized at only the surface portion and then the oxidation is not progressed any more after the surface oxidation. Still further, the double hollow needle 100 can be made of a metal and the metal portion is coated with an inorganic material.

In this embodiment, oxygen is used as the reaction gas but other oxidizable gases may be used. In this embodiment, decomposition of the organic insulation film 14 by ozone is exemplified, but the decomposition reaction of the organic insulation film 14 may be achieved by a combination of oxidation of the organic insulation film 14, decomposition of the oxide by ozone, or other reactions. Further, modification examples (see FIG. 28) of the seventh embodiment may be applied to this embodiment.

Tenth Embodiment

In this embodiment, a checking method for checking electrical conduction state in a contact hole will be explained.

Figure 33:
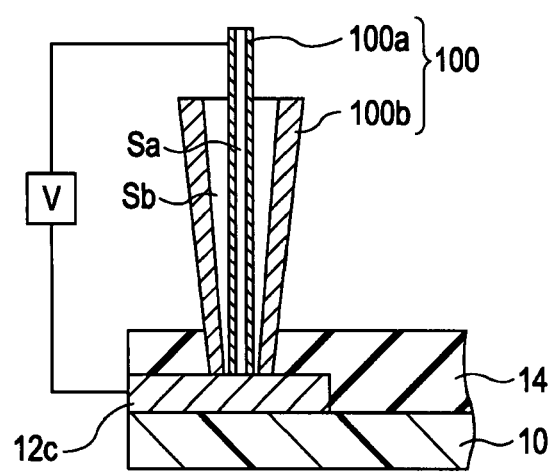
FIG. 33 is a process sectional view illustrating a semiconductor device manufacturing method according to a tenth embodiment.

FIG. 33 is a process sectional view illustrating a semiconductor device manufacturing method (contact hole forming method) according to this embodiment.

That is, after a contact hole C1c is formed, a double hollow needle 100 is moved downward into the contact hole C1c. Next, the first hollow needle (inner needle) 100a is moved downward so as to be contact with the surface of the conductive film 12c. Alternatively, the double hollow needle 100 may be moved downward after the tips of the first hollow needle (inner needle) 100a and the second hollow needle 100b are positioned at the same height.

Next, impedance between the first hollow needle (inner needle) 100a and the conductive film 12c is measured using a voltage meter V. High impedance means that residue of the organic insulation film 14 remains on the bottom of the contact hole C1c. Accordingly, suction of the residue is performed again using the double hollow needle 100 described in relation with the seventh embodiment, eighth embodiment, and ninth embodiment, so as to achieve reliable interconnection through the contact hole C1c.

In addition, the electrical conduction state in the contact hole may be checked using an ampere meter, an oscilloscope, or a combination thereof instead of the voltage meter. Here, in the case in which both the first hollow needle 100a and the second hollow needle 100b are made of a conductive material, the inner surface of the second hollow needle 100b may be coated with an insulation material in order to prevent the first hollow needle 100a and the second hollow needle 100b from being short circuited. Further, the entire body of the second hollow needle 100b may be made of an inorganic insulation material, such as ceramic.

In this embodiment, the electrical conduction state of the contact hole is checked using the first hollow needle 100a, but may be checked by inserting an electric bar (conductive material bar, conductive member) instead of the first hollow needle 100a so as to be brought into contact with the conductive film 12c.

According to this embodiment, it is possible to check electrical conduction state (being or non-being of residue) in the contact hole. Thus, it is possible to achieve reliable interconnection between the conductive film 12c and the gate electrode 15.

Eleventh Embodiment

In this embodiment, application of the invention to an electrophoretic device will be described in greater detail. In this embodiment, the same elements as those of the seventh embodiment are denoted by the same reference symbols and explanation on the same elements will be omitted.

FIGS. 34A to 34B, 35, 36A to 36B, 37, 38A to 38B, 39A to 39B, 40A to 40B, and 41 are process sectional views or plan views illustrating an electrophoretic device manufacturing method.

Figure 34A:
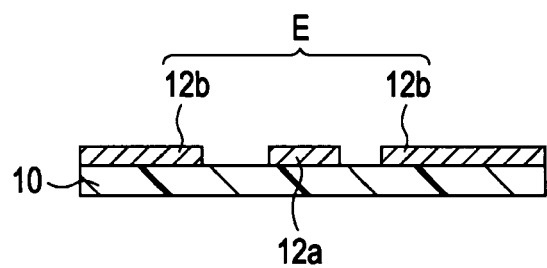
FIGS. 34A to 34B are process sectional views illustrating a semiconductor device manufacturing method according to an eleventh embodiment.
Figure 34B:
Figure 35:
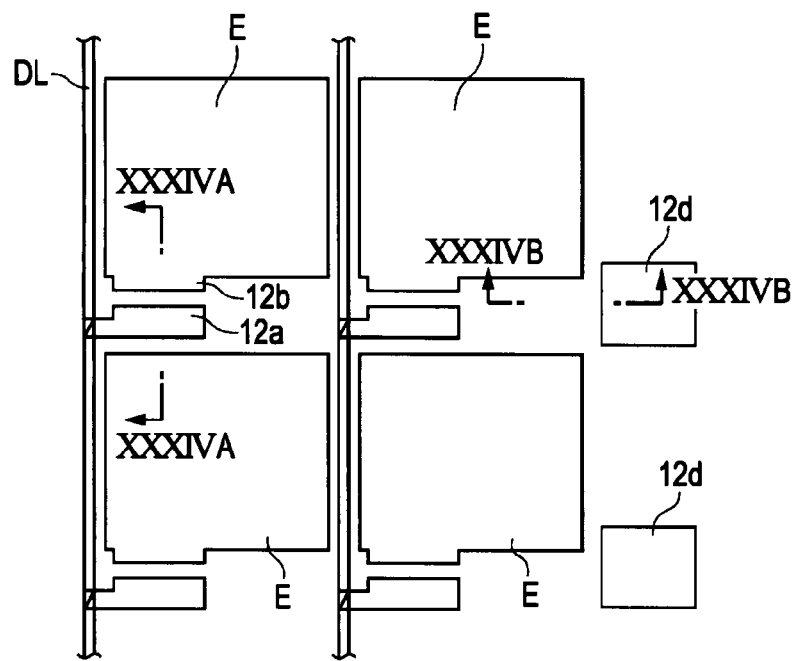
FIG. 35 is a plan view illustrating the semiconductor device manufacturing method (contact hole forming method) according to the eleventh embodiment.
Figure 41:
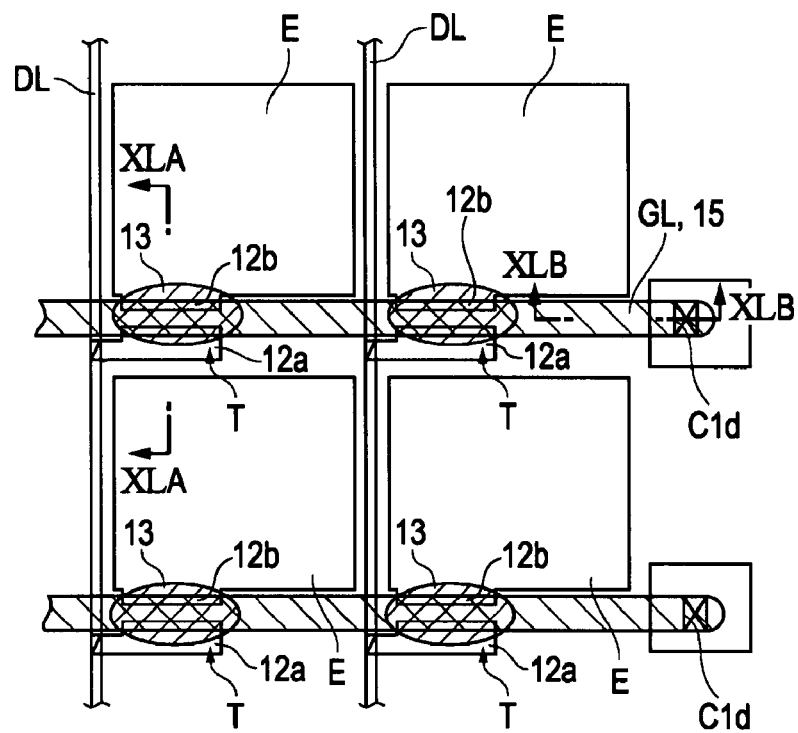
FIG. 41 is a plan view illustrating the semiconductor device manufacturing method (contact hole forming method) according to the eleventh embodiment.

As shown in FIGS. 34A to 34B and 35, a plastic substrate is prepared as an insulation substrate 10 and conductive films 12a to 12d are formed on the insulation substrate 10 as in the seventh embodiment. The conductive film 12b is part of a pixel electrode E. As shown in FIG. 41, a pixel is arranged at an intersection of a data line DL and a gate line GL via a transistor T. The conductive film 12d serves as a pad (pad electrode). Reference symbol DL denotes a data line. The data line DL is provided in an under layer (not shown) of the conductive films 12a to 12d and connected to the conductive film 12a via a contact hole (see FIG. 35).

Figure 36A:
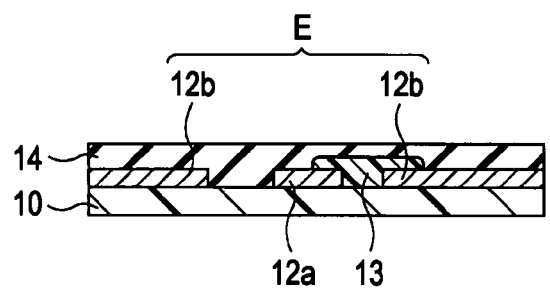
FIGS. 36A to 36B are process sectional views illustrating the semiconductor device manufacturing method (contact hole forming method) according to the eleventh embodiment.
Figure 36B:
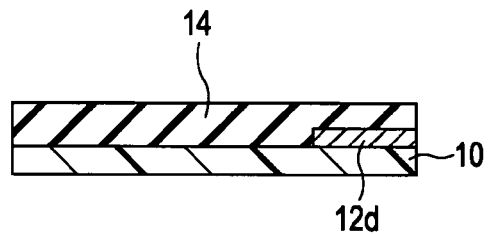
Figure 37:
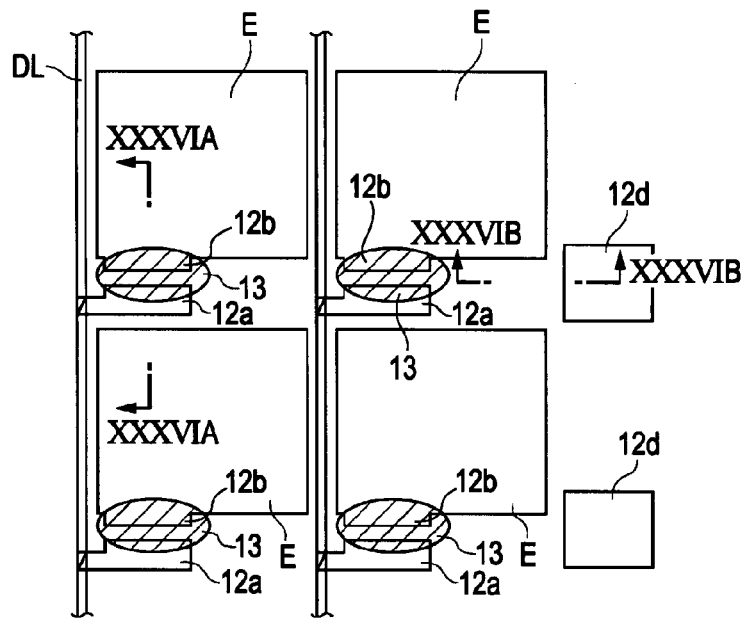
FIG. 37 is a plan view illustrating the semiconductor device manufacturing method (contact hole forming method) according to the eleventh embodiment.
Figure 38A:
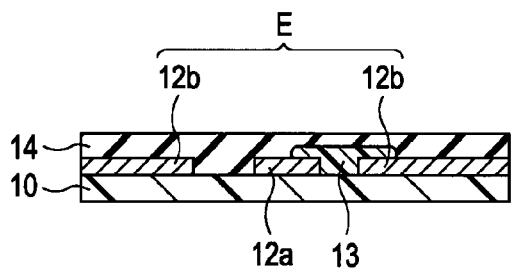
FIGS. 38A to 38B are process sectional views illustrating the semiconductor device manufacturing method (contact hole forming method) according to the eleventh embodiment.
Figure 38B:
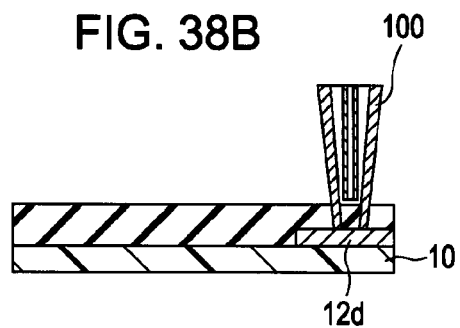
Figure 39A:
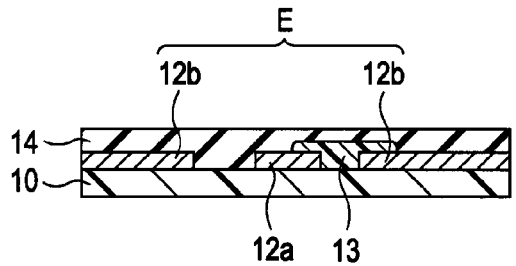
FIGS. 39A to 39B are process sectional views illustrating the semiconductor device manufacturing method according to the eleventh embodiment.
Figure 39B:
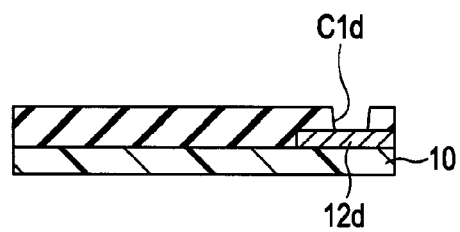

Next, as shown in FIGS. 36A to 36B and 37, an organic semiconductor film 13 is formed on the substrate 10 at a position between the conductive films 12a and 12b. The organic semiconductor film 13 is formed by ejecting an organic semiconductor material solution by a liquid ejection method (ink jet method) as in the seventh embodiment at the position between the conductive films 12a and 12b, and solidifying the ejected organic semiconductor material solution. Next, an organic insulation film 14 serving as an insulation film is formed on the substrate 10 as in the seventh embodiment. Part of the organic insulation film 14 formed on the organic semiconductor film 13 serves as a gate insulation film and another part of the organic insulation film 14 formed on the conductive films 12a to 12d serves as an inter-layer insulation film.

Next, as shown in FIGS. 38A, 38B, 39A, and 39B, a contact hole C1d is formed on the conductive film 12d. The contact hole C1d is formed by the method according to any of the methods according to the seventh to eleventh embodiments using the double hollow needle 100. The contact hole C1d may be formed by any of the methods according to the second to sixth embodiments using the hollow needle 100.

Figure 40A:
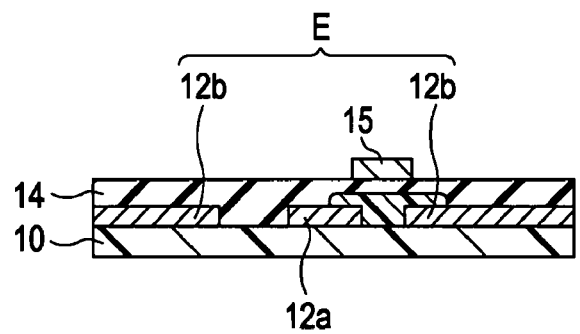
FIGS. 40A to 40B are process sectional views illustrating the semiconductor device manufacturing method (contact hole forming method) according to the eleventh embodiment.
Figure 40B:
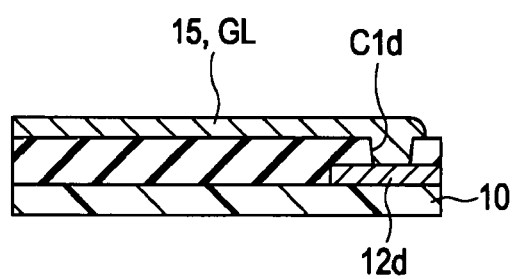

Next, as shown in FIGS. 40A, 40B, and 41, a gate electrode (gate line, gate wiring) 15 is formed on the organic insulation film 14 and in the contact hole C1d as in the seventh embodiment. For example, the gate electrode 15 is formed by ejecting a conductive material solution while moving a liquid ejection device nozzle (or the substrate 10) and solidifying the ejected solution so that the formed gate electrode is connected to the organic semiconductor film 13 extending in X direction (direction perpendicular to the data line DL). As shown in FIG. 41, the gate electrode 15 is a gate line GL extending in the X direction.

Next, an insulation film (not shown) serving as a protective film is formed on the gate electrode 15 as in the seventh embodiment.

Through the above-described processes, pixel electrodes E and a transistor are formed.

As described above, according to this embodiment, the amount of residue in the contact hole is reduced. Accordingly, it is possible to achieve reliable interconnection between the conductive film 12d and the gate electrode (gate line) 15.

Further, since there is no need to form a photoresist film on the organic insulation film 14, it is possible to decrease damage caused to the organic insulation film 14, the damage being attributable to resist residue generated due to adhesion between the photoresist film and the organic insulation film 14 and over-etching of the photoresist film. Further, it is possible to form the contact hole C1d without using a photolithography process, and thus it is possible to the organic semiconductor film 14 from deteriorating by exposure. As a result, it is possible to enhance the characteristic of the transistor T.

Next, the electrophoretic device is completed by fixing microcapsules between the substrate 10 and another substrate having opposing electrodes thereon by binders. In the microcapsule, electrophoretic particles and electrophoresis dispersion are sealed.

In the seventh to eleventh embodiments, a dissolving liquid or a decomposing gas is introduced into the hollow Sa of the first hollow needle (inner needle) 100a and reaction products are sucked through the hollow Sb of the second hollow needle (outer needle) 100b, but the hollows Sa and Sb may be conversely used for liquid or gas introduction and reaction product suction. That is, the dissolving liquid or the decomposing gas is introduced into the hollow Sb of the second hollow needle (outer needle) 100b and the reaction product may be sucked through the hollow Sa of the first hollow needle (outer needle) 100a. Through which hollow Sa or Sb the dissolving liquid or the decomposing gas is introduced is determined according to properties of the dissolving liquid or the decomposing gas (for example, viscosity), a fluid flow rate, and properties of reaction products. The sectional area ratio of the hollows Sa and Sb (a ratio of an introduction side sectional area to a suction side sectional area) may be determined according to properties of the dissolving liquid or the decomposing gas, a fluid flow rate, or properties of the reaction product.

Structure of a Hollow Needle

A structure of a very thin hollow needle used in the second to eleventh embodiments will be described. The very thin hollow needle can be manufactured by methods shown in FIGS. 43A to 43D and 44A to 44F. FIGS. 43A to 43D and 44A to 44F illustrate the method of processing the very thin hollow needle.

As shown in FIGS. 43A to 43F, for example, a stainless steel plate (iron plate) having a trapezoid shape, a thickness of 50 μm, and a width of 600 μm undergoes a press working so as to manufacture a very thin hollow needle having a sharp tip and a tapered cylinder shape.

Figure 44A:
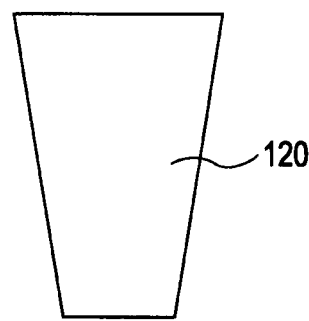
FIGS. 44A to 44F are views illustrating a method of processing a very thin hollow needle.
Figure 44B:
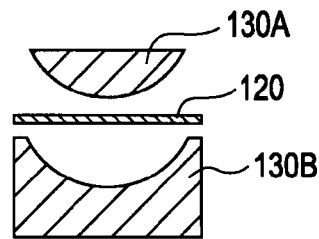
Figure 44C:
Figure 44D:
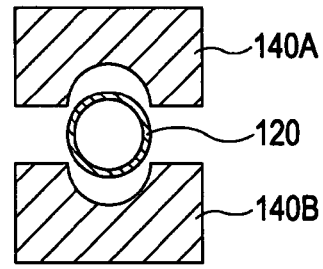
Figure 44E:
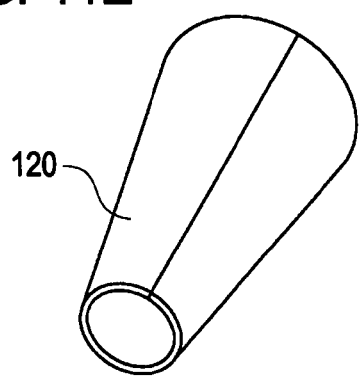

For example, as shown in FIG. 44A, a stainless steel 120 is pressed by molds 130A and 130B each having a curved portion so that the stainless steel plate 120 comes to have a curved surface. The stainless steel 120 with the curved surface is pressed again by molds 140A and 140B having a cylinder-shaped curve when they are combined. As a result, a hollow needle is manufactured (see FIGS. 44B to 44D).

By use of the press working using ductility of a metal, it is possible manufacture a hollow needle having the minimum diameter of 100 μm. Further, the hollow needle can be made of aluminum Al, copper Cu, titanium Ti, nickel Ni, cobalt Co, molybdenum Mo, platinum Pt, or an alloy thereof can be used instead of stainless steel.

Figure 44F:
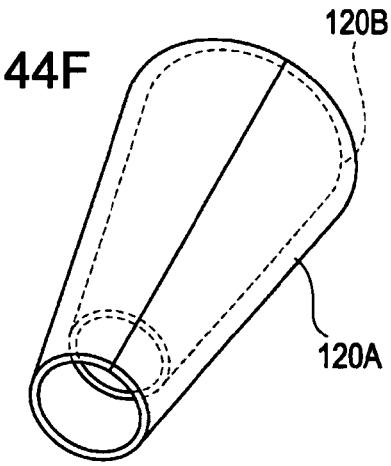

In addition, as shown in FIG. 44F, a double hollow needle can be manufactured by preparing hollow needles having different diameters and inserting one hollow needle 120A with a relatively small diameter in the other hollow needle 120B with a relatively large diameter. According to this method, it is possible to manufacture an inner needle having a small diameter.

Electronic Apparatus

Figure 42A:
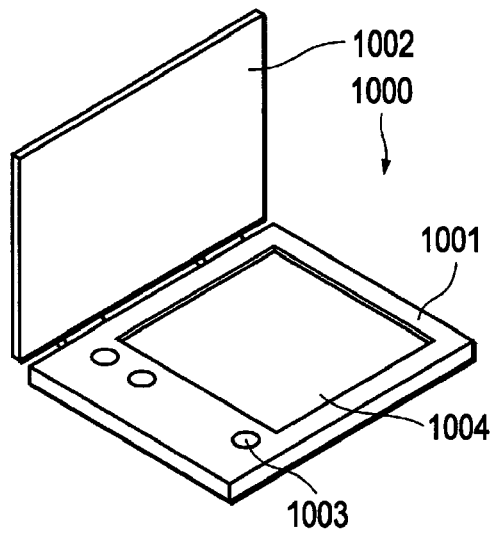
FIGS. 42A to 42C are perspective views illustrating concrete examples of electronic apparatuses to which an electrophoresis device is applied.
Figure 42B:
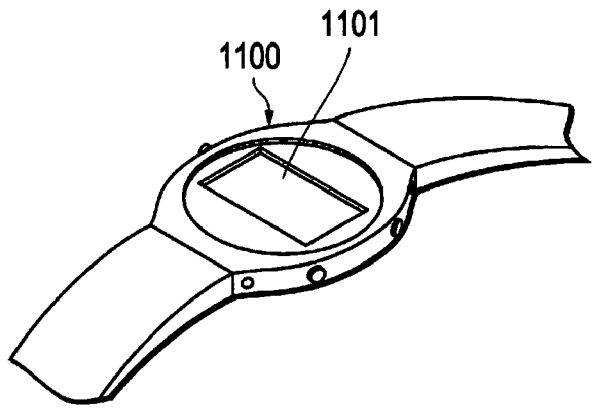
Figure 42C:
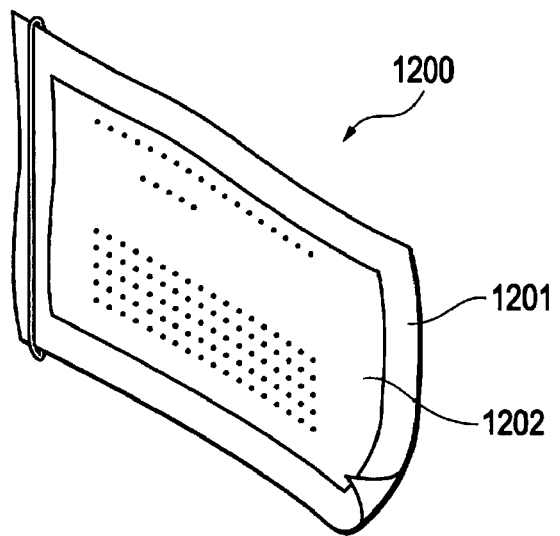
Figure 43A:
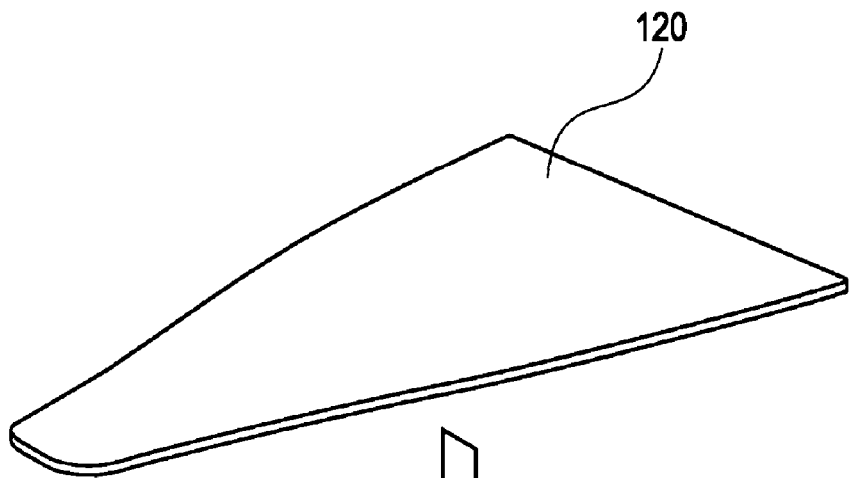
FIGS. 43A to 43D are views illustrating a method of processing a very thin hollow needle.
Figure 43B:
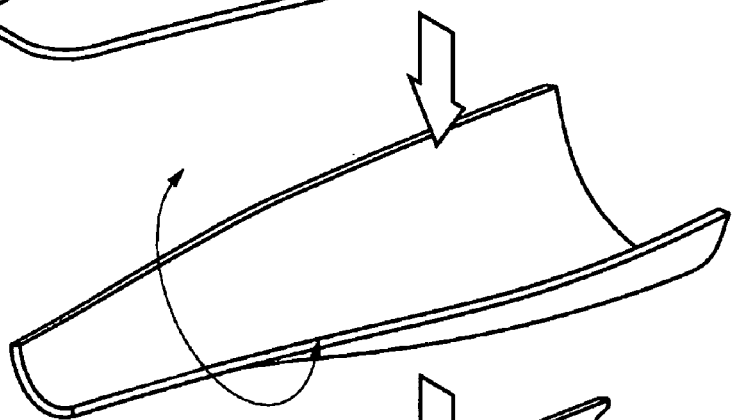
Figure 43C:
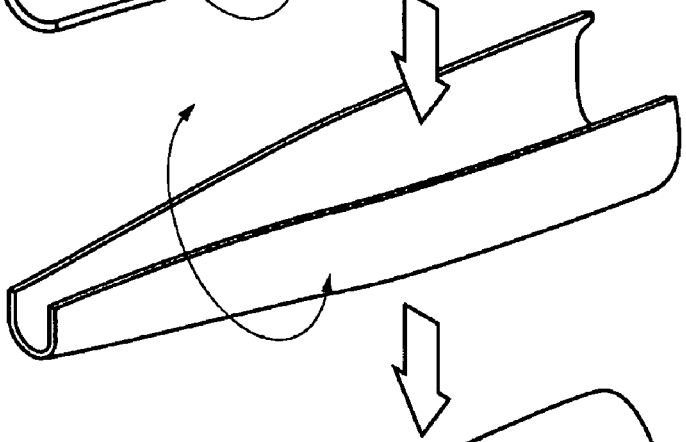
Figure 43D:
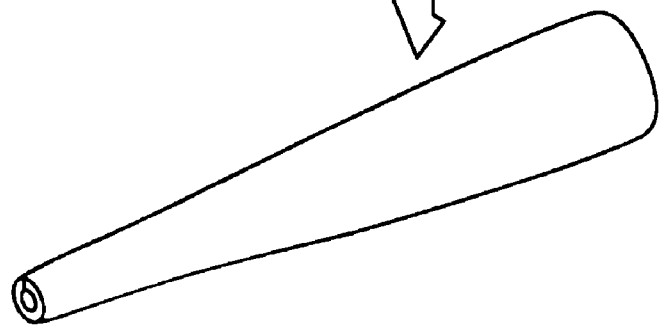

Hereinafter, a concrete example of an electronic apparatus to which the electrophoretic device is applied will be described. FIGS. 42A to 42C are perspective views illustrating an electronic apparatus to which an electrophoretic device is applied.

FIG. 42A is a perspective view illustrating an electronic book which is an example of the electronic apparatus. The electronic book 1000 includes a frame 1001 having a book shape, a cover 1002 coupled to the frame 1001 in a pivoting (openable) manner, a manipulation portion 1003, and a display portion 1004 constituted by the electrophoretic device according to the embodiment.

FIG. 42B is a perspective view illustrating a wrist watch, an example of the electronic apparatus. The electronic wrist watch 1100 includes a display portion 1101 constituted by the electrophoretic device according to the embodiment.

FIG. 42C is a perspective view illustrating an electronic paper as an example of the electronic apparatus. The electronic paper 1200 includes a main body 1201 made of a rewritable sheet having a texture of paper and flexibility and a display portion 1202 constituted by the electrophoretic device according to the embodiment.

By constituting the display portion so as to have the electrophoretic device, it is possible to improve the characteristic of the electronic apparatus. Further, it is possible to manufacture electronic apparatuses having good characteristics.

Electronic apparatuses to which the electrophoretic device can be applied are not limited to the above examples but may include apparatuses using change of the visible color tone caused due to migration of charged particles. For example, things belonging to real assets with a wall to which an electrophoretic film is attached and things belonging to movable bodies, such as vehicles, planes, and ships may be in the range of the apparatus.

In the embodiments, the electrophoretic device is exemplified, but the invention may be applied to electro-optical devices, such as liquid crystal device and organic electroluminescent (EL) device or electronic apparatuses using the same.

The first to eleventh embodiments relate to the contact holes for gate electrode connection but the invention may be applied to contact holes for connection of various wirings. For example, the invention may be applied to a contact between a wiring formed on a wiring substrate and an element or between wirings in different layers.

The above-mentioned embodiments and modification examples may be appropriately combined, further modified, or changed according to uses. That is, the invention may not be limited to the above description.

What is claimed is:

1. A method of forming a contact hole, comprising:
    forming a first conductive layer patterned so as to serve as an electrode or a wiring on a substrate;
    forming an insulation layer on the substrate and the first conductive layer;
    inserting a cutting instrument into the insulation layer at an angle to a surface of the insulation layer, the angle being in the range from 5° to 80°; and
    forming a tapered opening extending to the electrode or the wiring in the insulation layer by drawing out the cutting instrument.

2. The method of forming a contact hole according to claim 1, further comprising moving the cutting instrument inserted into the insulation layer in a direction in which the electrode or the wiring extends, after the moving the cutting instrument is performed after the inserting a cutting instrument.

3. The method of forming a contact hole according to claim 1, further comprising depositing a conductive material on the insulation layer and in the tapered opening by moving a liquid ejection head relative to the substrate in a direction in which the cutting instrument is inserted, thereby forming a second conductive film patterned to serve as an electrode or a wiring, wherein the depositing is performed after the formatting a tapered opening.

4. The method of forming a contact hole according to claim 1, further comprising performing surface treatment with respect to a surface of the electrode or the wiring formed of the first conductive layer at a position where the opening is formed in order to degrade adhesion between the electrode or the wiring and the insulation layer.

5. The method of forming a contact hole according to claim 1, wherein the substrate is heated during the inserting a cutting instrument.

6. The method of forming a contact hole according to claim 1, wherein the angle of the cutting instrument when the cutting instrument is inserted is in the range from 20° to 60°.

7. A method of manufacturing a wiring board, comprising:
    the method of forming a contact hole according to claim 1; and
    forming a second conductive film in the opening and on the insulation film.

8. A method of manufacturing a semiconductor device, comprising:
    the method of forming a contact hole according to claim 1; and
    forming an organic semiconductor film at a position under the insulation film.

9. A method of manufacturing an electro-optical device comprising the method according to claim 8.

10. A method of forming a contact hole, comprising:
    forming a first conductive film patterned so as to serve as an electrode or a wiring on a substrate;
    forming an insulation film on the substrate and the first conductive film;
    bringing a hollow needle having a hollow therein into contact with a surface of the first conductive film by allowing the hollow needle to penetrate through the insulation film;
    supplying a dissolving liquid to the insulation film through the hollow;
    stripping off the insulation film in the hollow of the hollow needle by lowering a pressure in the hollow; and
    forming an opening on the first conductive film by removing the stripped insulation film in the hollow.

11. The method of forming a contact hole according to claim 10, wherein light is irradiated through the hollow onto the insulation film while the hollow needle is in contact with the first conductive film.

12. The method of forming a contact hole according to claim 10, wherein the hollow needle is heated while the hollow needle is in contact with the first conductive film.

13. The method of forming a contact hole according to claim 10, further comprising checking an electrical conduction state between the first conductive film and an electrical conductive member by bringing the electrical conductive member into contact with a bottom surface of the opening by inserting the electrical conductive member through the hollow after performing the forming an opening.

14. A method of forming a contact hole, comprising:
   forming a first conductive film patterned so as to serve as an electrode or a wiring on a substrate;
   forming an insulation film on the first conductive film and the substrate;
   bringing a double hollow needle including a first needle having a first hollow and a second needle having a second hollow surrounding the first needle into contact with the first conductive film through the insulation film; and
   injecting a dissolving liquid or a decomposing gas which can dissolve or decompose the insulation film into the first hollow and sucking dissolved or decomposed insulation film through the second hollow; or
   injecting the dissolving liquid or the decomposing gas which can dissolve or decompose the insulation film into the second hollow and sucking dissolved or decomposed insulation film through the first hollow.

15. The method of forming a contact hole according to claim 14, wherein a tip of the first needle is set apart from a tip of the second needle inside the second needle by a predetermined distance.

16. The method of forming a contact hole according to claim 14, wherein the decomposing gas is an oxidizable gas.

17. The method of forming a contact hole according to claim 14, wherein ultraviolet rays are irradiated onto the decomposing gas while the decomposing gas is injected.

18. The method of forming a contact hole according to claim 15, wherein a thickness of the insulation film is not larger than the predetermined distance.

19. A method of forming a contact hole, comprising:
   forming a first conductive film patterned so as to serve as an electrode or a wiring on a substrate;
   forming an insulation film on the substrate and the first conductive film;
   bringing a hollow needle having a hollow therein into contact with a surface of the first conductive film by allowing the hollow needle to penetrate through the insulation film;
   stripping off the insulation film in the hollow of the hollow needle by lowering a pressure in the hollow;
   forming an opening on the first conductive film by removing the stripped insulation film in the hollow; and
   checking an electrical conduction state between the first conductive film and an electrical conductive member by bringing the electrical conductive member into contact with a bottom surface of the opening by inserting the electrical conductive member through the hollow.

* * * * *